(12) United States Patent
Fujii et al.

(10) Patent No.: US 11,164,990 B2
(45) Date of Patent: Nov. 2, 2021

(54) OPTICAL DEVICE AND DISPLAY APPARATUS

(71) Applicant: Sony Corporation, Tokyo (JP)

(72) Inventors: Kentaro Fujii, Kanagawa (JP); Tomoki Ono, Kanagawa (JP)

(73) Assignee: Sony Corporation, Tokyo (JP)

( * ) Notice: Subject to any disclaimer, the term of this patent is extended or adjusted under 35 U.S.C. 154(b) by 559 days.

(21) Appl. No.: 16/097,755

(22) PCT Filed: Apr. 14, 2017

(86) PCT No.: PCT/JP2017/015241
§ 371 (c)(1),
(2) Date: Oct. 30, 2018

(87) PCT Pub. No.: WO2017/217101
PCT Pub. Date: Dec. 21, 2017

(65) Prior Publication Data
US 2020/0403115 A1 Dec. 24, 2020

(30) Foreign Application Priority Data
Jun. 13, 2016 (JP) .............................. JP2016-116957

(51) Int. Cl.
*H01L 33/00* (2010.01)
*G02B 26/08* (2006.01)
(Continued)

(52) U.S. Cl.
CPC ...... *H01L 33/0045* (2013.01); *G02B 26/0816* (2013.01); *G02B 26/101* (2013.01);
(Continued)

(58) Field of Classification Search
CPC ..... H01L 33/0045; H01L 33/38; H01L 33/10; G02B 26/0816; G03B 21/14; G03B 21/2033; G09G 3/025
See application file for complete search history.

(56) References Cited

U.S. PATENT DOCUMENTS 10,691,005 B2 * 6/2020 Fujii ................. G03B 21/2053
2004/0126063 A1 7/2004 Alphonse
(Continued)

FOREIGN PATENT DOCUMENTS

JP H02-310975 A 12/1990
JP H08-236853 A 9/1996
(Continued)

OTHER PUBLICATIONS

International Search Report and Written Opinion issued in connection with International Patent Application No. PCT/JP2017/015241, dated Jun. 20, 2017. (8 pages).

*Primary Examiner* — William C. Dowling
(74) *Attorney, Agent, or Firm* — K&L Gates LLP

(57) ABSTRACT

[Object] To provide an optical device and a display apparatus capable of decreasing a waveguide loss, inhibiting a laser oscillation, and achieving a high-output.
[Solving Means] An optical device includes a first electrode layer, a first conduction type layer, a second conduction type layer, an active layer, and a second electrode layer. The first conduction type layer includes a current injection region formed by the first electrode layer and a current non-injection region. A waveguide structure included in the first conduction type layer, the active layer, and the second conduction type layer includes a first region and a second region. The first region has a first waveguide that is the current injection region and the current non-injection region and having a first refractive index difference. The second region has a second waveguide arranged to be extended
(Continued)

from the first waveguide to the first end and has a second refractive index difference greater than the first refractive index difference. The second waveguide has a reflection structure that reflects light entered from the first waveguide and slopes an optical axis and a taper structure that decreases a size of a beam spot of light entered from the reflection structure.

15 Claims, 17 Drawing Sheets

(51) Int. Cl.
| | |
|---|---|
| *G02B 26/10* | (2006.01) |
| *G09G 3/02* | (2006.01) |
| *H01L 33/38* | (2010.01) |
| *H01L 33/10* | (2010.01) |
| *G03B 21/14* | (2006.01) |
| *H01L 33/20* | (2010.01) |
| *G03B 21/20* | (2006.01) |

(52) U.S. Cl.
CPC .............. *G03B 21/14* (2013.01); *G09G 3/025* (2013.01); *H01L 33/10* (2013.01); *H01L 33/20* (2013.01); *H01L 33/38* (2013.01); *G03B 21/2033* (2013.01); *G09G 2320/0646* (2013.01)

(56) References Cited

U.S. PATENT DOCUMENTS

| | | |
|---|---|---|
| 2009/0152528 A1 | 6/2009 | Song et al. |
| 2009/0225801 A1 | 9/2009 | Mori et al. |
| 2014/0192827 A1 | 7/2014 | Oh et al. |
| 2017/0047480 A1 | 2/2017 | Watanabe et al. |
| 2019/0285975 A1* | 9/2019 | Fujii ...................... H01L 33/10 |

FOREIGN PATENT DOCUMENTS

| | | | |
|---|---|---|---|
| JP | 2010-225978 | | 10/2010 |
| JP | 2010-225978 A | | 10/2010 |
| JP | 2013-004855 A | | 1/2013 |
| WO | 2007/040108 A1 | | 4/2007 |
| WO | 2015/163057 A1 | | 10/2015 |
| WO | WO-2017217101 A1 * | 12/2017 | ......... H01L 33/0045 |

* cited by examiner

OPTICAL DEVICE AND DISPLAY APPARATUS

CROSS-REFERENCE TO RELATED APPLICATIONS

The present application claims the benefit of International Application No. PCT/JP2017/015241, filed Apr. 14, 2017, which claims priority to Japanese Application No. 2016-116957, filed Jun. 13, 2016, the disclosures of which are incorporated herein by reference.

BACKGROUND

The present technology relates to a technology of a semiconductor laser and a super luminescent diode (SLD).

As an optical device, a super luminescent diode (SLD) has a feature of having a wide light-emitting spectrum width relatively close to that of a light-emitting diode and of emitting light at a narrow angle of radiation with a high intensity like a semiconductor laser in a light-emitting state at the same time. For example, the light-emitting device can be used as a light source of a projector, which needs high brightness.

An SLD disclosed in Patent Literature 1 includes a linear ridge waveguide formed orthogonal to a cleavage end face and a curved guide active layer continuously arranged in a curve in a plan view. At a cleavage end face, an AR (antireflection) film may be used.

In the SLD having such a structure, the most part of light generated on the active layer directly under the linear ridge waveguide proceeds toward the curved guide active layer. The light proceeding toward the curved guide active layer is separated into light leaked due to the curve, light guided to an end face (end face at an opposite side of a cleavage end face) and reflected by the end face, and light absorbed while being guided.

According to this structure, as the light leaked due to the curve and the light reflected by the opposite end of the cleavage end face cannot be returned to a linear active layer, laser mode oscillation is inhibited (for example, see Patent Literature 1, p. 2, lower right column to p. 3, upper left column, FIG. 1).

In short, the SLD does not have the structure that light goes to and fro between mirrors arranged on both end faces like a general laser diode (LD) but has the structure that light is passed through the waveguide in one way and is amplified (stimulated emission occurs). A different point between the both is that a spectrum width of a wavelength of output light of the SLD is much wider than that of the LD.

Patent Literature 2 discloses a semiconductor laser structure (not an SLD). The semiconductor laser includes a ridge and a wing arranged on a top of a second clad layer, i.e., a p-type clad layer and a groove formed from an upper face of the p-type clad layer to the inside between the ridge and the wing.

In relation to widths of the ridge and the groove in the horizontal direction (direction orthogonal to the light emission direction), a groove width at a region of a rear end face side is narrower than a groove width at a region of a front end face side. This structure allows the emission loss of high order lateral mode light to be suppressed (for example, see Patent Literature 2, FIGS. 1 and 2).

CITATION LIST

Patent Literature

Patent Literature 1: 2-310975
Patent Literature 2: 2013-4855

SUMMARY

Technical Problem

In an optical device such as laser, an SLD, and the like, enlarging a current-carrying area, e.g., enlarging a stripe width, allows high-output. With the enlarged stripe width, a light confinement width is enlarged and the size of a spot of an emitted beam is increased. Depending on the usage of the light-emitting device, a large spot size beam may be difficult to be handled. In other words, it is difficult to increase a light output and inhibit enlargement of the light confinement width at the same time.

In the structure of Patent Literature 1, the curved guide active layer (waveguide) is used and a rear (cleavage end face) side is orthogonal to an end face to increase light utilization efficiency. At a front (light-outgoing face) side, an optical axis is sloped from the end face to inhibit light resonance and a wide stripe width and a high-output are achieved.

However, an arc curvature of the curved guide active layer leads to a waveguide loss. In order to suppress the waveguide loss, it needs to increase a curvature radius and to bring the curved guide active layer close to linear. However, if the curvature radius is increased, an angle with respect to the end face is closer to orthogonal. Undesirably, it cannot inhibit a laser oscillation needed to the SLD.

The present technology is made in view of the above-mentioned circumstances, and it is an object of the present technology to provide an optical device and a display apparatus capable of decreasing a waveguide loss, inhibiting a laser oscillation, and achieving a high-output.

Solution to Problem

In order to achieve the object, an optical device according to an embodiment of the present technology includes a substrate, a first end being a light-outgoing end, and a second end arranged at a side opposite to the first end. The optical device includes a first electrode layer, a first conduction type layer, a second conduction type layer, an active layer, and a second electrode layer.

The first electrode layer is a stripe-shaped electrode layer extending from the second end to the first end.

The first conduction type layer includes a current injection region formed by the first electrode layer and a current non-injection region.

The second conduction type layer is arranged on the substrate.

The active layer is arranged between the first conduction type layer and the second conduction type layer.

The second electrode layer is in contact with the substrate or the second conduction type layer.

A waveguide structure included in the first conduction type layer, the active layer, and the second conduction type layer includes a first region and a second region.

The first region has a first waveguide that is the current injection region and the current non-injection region and having a first refractive index difference between a refractive index of the current injection region and a refractive index of the current non-injection region.

The second region is arranged between the first region and the first end having a second waveguide arranged to be extended from the first waveguide to the first end and has a second refractive index difference between a refractive index of the second waveguide and a refractive index of a region around the second waveguide in the second region, the second refractive index difference being greater than the first refractive index difference.

The second waveguide has a reflection structure that reflects light entered from the first waveguide and slopes an optical axis and a taper structure that decreases a size of a beam spot of light entered from the reflection structure.

Since the second refractive index difference in the second region is greater than the first refractive index difference in the first region, and the second waveguide in the second region has the taper structure that decreases the size of the beam spot, a light confinement action in the second region is promoted. Specifically, without increasing the size of the beam spot, a high-output can be achieved. In addition, by the reflection structure of the second waveguide, an optical axis of light outgoing from the first waveguide is sloped. Thus, it prevents reflected light at a light-outgoing end from reaching the first waveguide and being amplified (laser oscillation).

The reflection structure may include a reflection face having an intersection point with an extension of a center line of the first waveguide.

With this structure, light outgoing from the first waveguide is reflected by the reflection face and the optical axis is sloped.

The taper structure may have a narrower width toward the first end.

With this structure, light entered the second waveguide travels through the taper structure and is collected, to thereby decreasing the size of the beam spot.

The first region of the waveguide structure may have first recesses arranged to sandwich the first waveguide as the current non-injection region. In addition, the second region of the waveguide structure may have second recesses arranged to sandwich the second waveguide as the region around the second waveguide, the second recesses being deeper than the first recesses.

In the waveguide structure, since the depths of the second recesses are deeper than the depths of the first concave portion, the second refractive index difference in the second region can be greater than the first refractive index difference in the first region.

The second recesses may include bottom faces arranged at a position deeper than a position of the active layer.

With this structure, a light confinement action in the second region can be promoted.

The optical device may further include a dielectric layer covering the second recesses.

A first width being an end width of a first region side of the second waveguide may be wider than a second width being an end width of a second region side of the first waveguide.

With this structure, all amount of light generated and transmitted in the first waveguide can be reliably led to the second waveguide and a light loss can be suppressed.

A third width being a width at the first end of the second waveguide may be narrower than the second width. With this structure, the size of the beam spot can be decreased and the high-output can be promoted.

The second waveguide may be structured such that an optical axis of light outgoing from the second waveguide is not orthogonal to an end face of the first end.

With this structure, it prevents light outgoing from the second waveguide and reflected by the end face of the first end from reaching the first waveguide via the second waveguide.

The second waveguide may be structured such that the slope of the optical axis of the light outgoing from the second waveguide toward a line perpendicular to the end face of the first end is 3 degrees or more.

If a slope (light-outgoing angle) of the center line of the second waveguide toward the line perpendicular to the end face of the first end is less than 3 degrees, the reflected light from the end face of the first end returns to the second waveguide. Thus, the angle is preferably 3 degrees or more.

The first waveguide may be structured such that a center line of the first waveguide is straight.

Since an optical axis of light outgoing from the first waveguide is sloped by the reflection structure of the second waveguide, the first waveguide can be linear and a waveguide loss generated by the curved first waveguide can be suppressed.

The first waveguide may be structured such that an extended line of the center line of the first waveguide is orthogonal to the end face of the first end.

Since an optical axis of light outgoing from the first waveguide is sloped by the reflection structure of the second waveguide, the center line of the first waveguide can be orthogonal to the end face of the first end.

The first waveguide may be structured such that an extended line of the center line of the first waveguide is orthogonal to the end face of the second end.

Light generated at the first waveguide is reflected by an end face of the second end. When the reflected light enters the first waveguide, outgoing light from the first end is preferably increased. With the structure such that the center line of the first waveguide is orthogonal to the end face of the second end, the reflected light at the end face of the second end easily enters the first waveguide.

The optical device may be a super luminescent diode.

A display apparatus according to an embodiment of the present technology includes the above-described optical device and an image generation unit.

The image generation unit is capable of two-dimensionally scanning the light outgoing from the optical device and controlling brightness of the light projected on the basis of image data.

Advantageous Effects of Invention

As described above, according to the present technology, an optical device and a display apparatus capable of decreasing a waveguide loss, inhibiting a laser oscillation, and achieving a high-output can be provided.

Note that the effects described here are not necessarily limitative and may be any of effects described in the present disclosure.

DETAILED DESCRIPTION

Hereinafter, embodiments of the present technology will be described with reference to the drawings. In the following description, with reference to the drawings, words such as "up", "down", "left", "right", "vertical", and "horizontal" may be used to indicate the directions and positions of devices and components. These words are only for convenience of description. In other words, these words are often used for ease of description and may not correspond to the directions and positions in a situation devices and apparatuses are actually manufactured and used.

1. Optical Device

1.1) Structure of Optical Device

Figure 1:
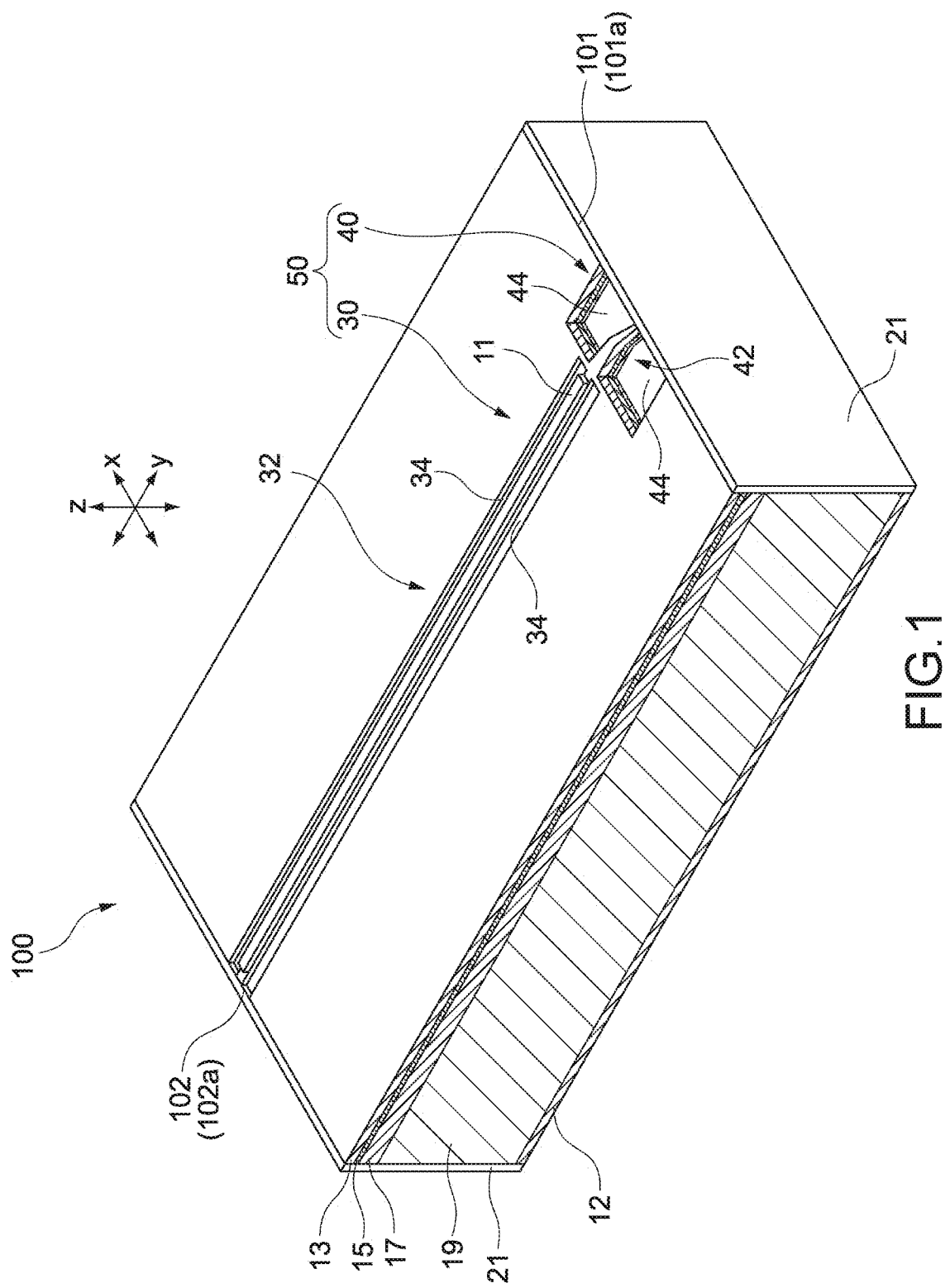
FIG. 1 is a perspective view showing an optical device according to an embodiment of the present technology.
Figure 2:
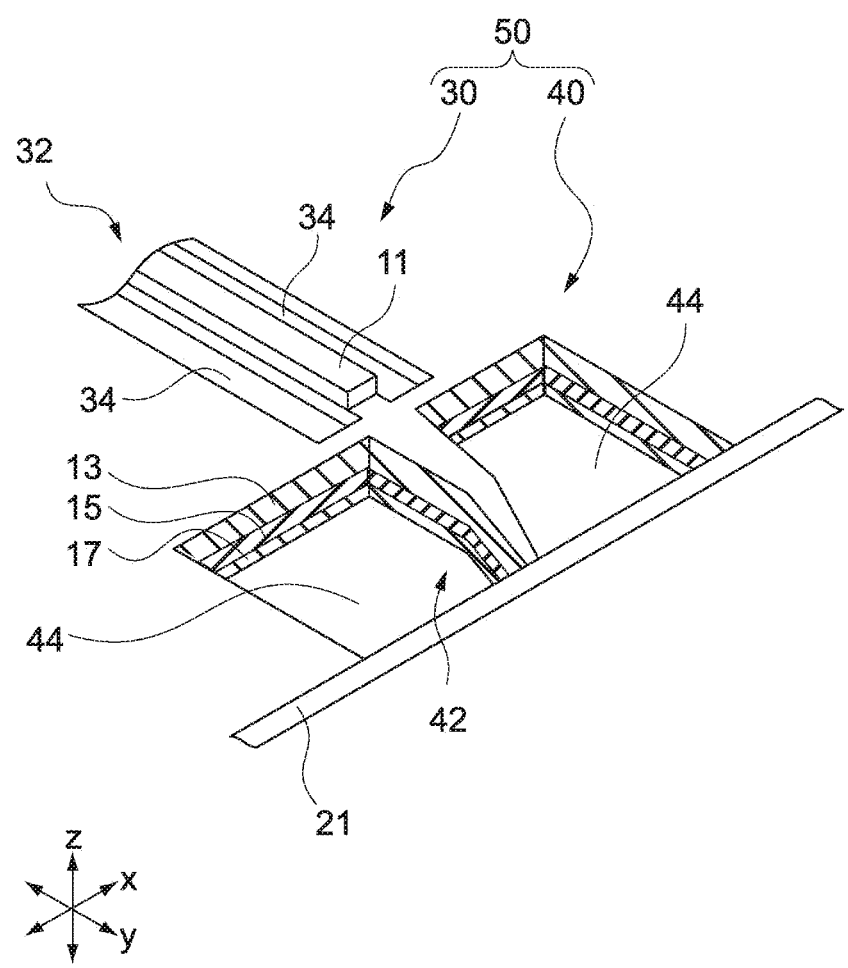
FIG. 2 is an enlarged view showing the optical device of FIG. 1.

FIG. 1 is a perspective view showing an optical device 100 according to an embodiment of the present technology. FIG. 2 is a plan view showing the optical device of FIG. 1. The optical device 100 according to this embodiment is a super luminescent diode (SLD) including a ridge-type waveguide. At left of FIG. 1, an enlarged cross section of semiconductor layers of the optical device 100 is mainly shown.

As shown in FIG. 1 and FIG. 2, the optical device 100 includes a first electrode layer 11, a first conduction type layer 13, an active layer 15, a second conduction type layer 17, a substrate 19, and a second electrode layer 12 in this order from an upper layer side. The first conduction type layer 13 is, for example, of a p-type conduction type and the second conduction type layer 17 is, for example, of an n-type conduction type. Also with reference to FIG. 4B, the structure of each layer is easily understood.

The first conduction type layer 13 includes a clad layer and a guide layer (not shown) in this order formed from a first electrode layer 11 side. The second conduction type layer 17 includes a clad layer and a guide layer (not shown) in this order formed from a substrate 19 side. The second electrode layer 12 is arranged being in contact with a back surface of the substrate 19.

Note that the first conduction type layer 13 may include a contact layer in a region being in contact with the first electrode layer 11. In addition, an n-type buffer layer may be arranged between the substrate 19 and the second conduction type layer 17. The second electrode layer 12 may be arranged being in directly contact with the second conduction type layer 17.

The optical device 100 includes a light-outgoing end (first end) 101 and a rear end 102 being an opposite end (second end). Dielectric films 21 are arranged on the light-outgoing end 101 and the rear end 102, respectively. The dielectric film 21 arranged on the light-outgoing end 101 has a low reflectance. The dielectric film 21 arranged on the rear end 102 has a high reflectance.

Hereinafter, the longitudinal direction of the optical device 100 is denoted by the y direction and the orthogonal direction is denoted by the x direction for the purpose of description. In addition, the direction orthogonal to the x and y directions denotes the z direction.

Note that according to this embodiment, the "light-outgoing end" and the "rear end" mean ends of the device formed of a semiconductor material. In this sense, the materials of the "light-outgoing end" and the "rear end" do not include the dielectric films 21 arranged on both end faces. However, even if the "light-outgoing end" and the "rear end" of the optical device 100 may include the dielectric films 21, there are no contradictions in the following description.

Figure 3:
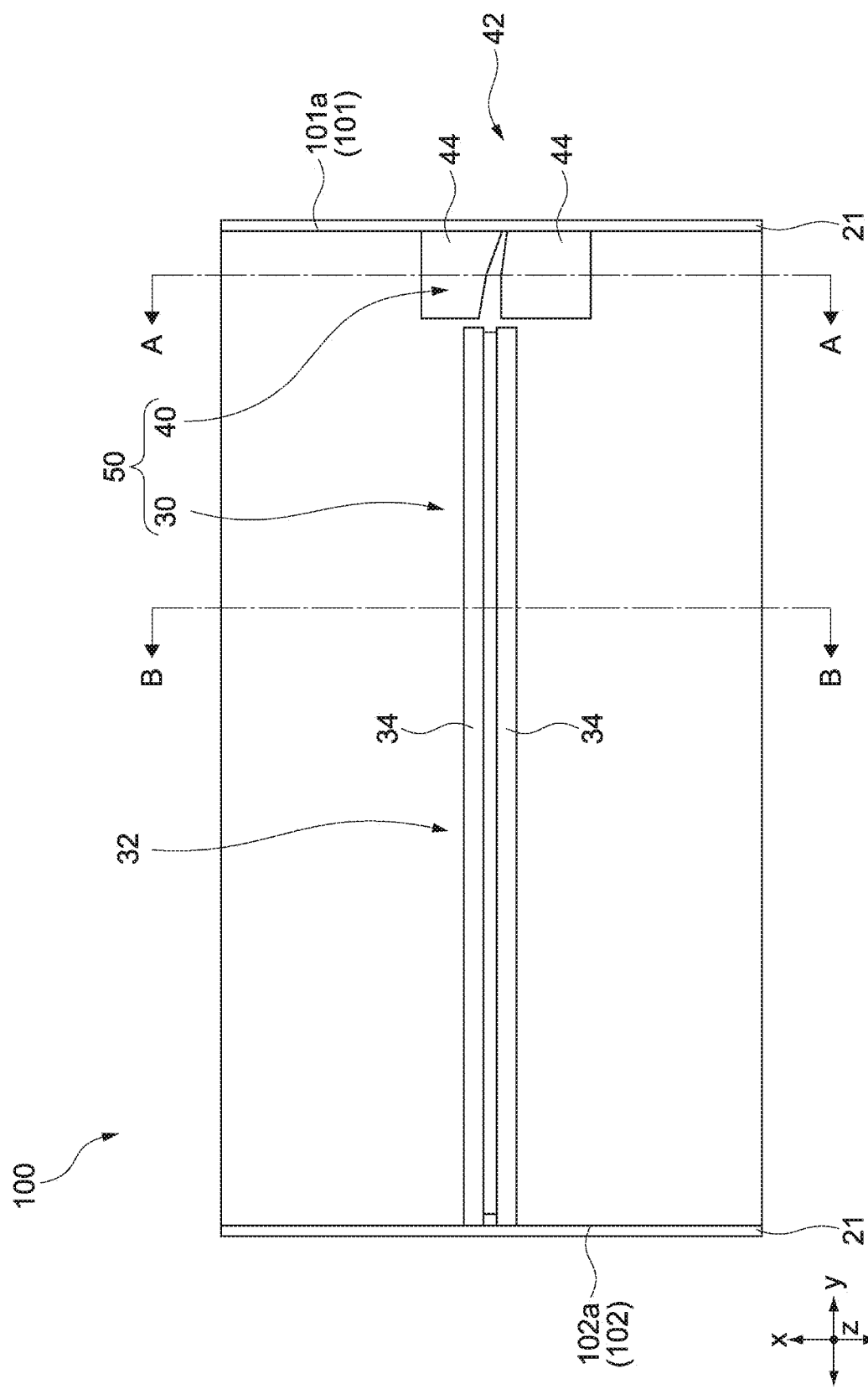
FIG. 3 is a plan view showing the optical device of FIG. 1.
Figure 4:
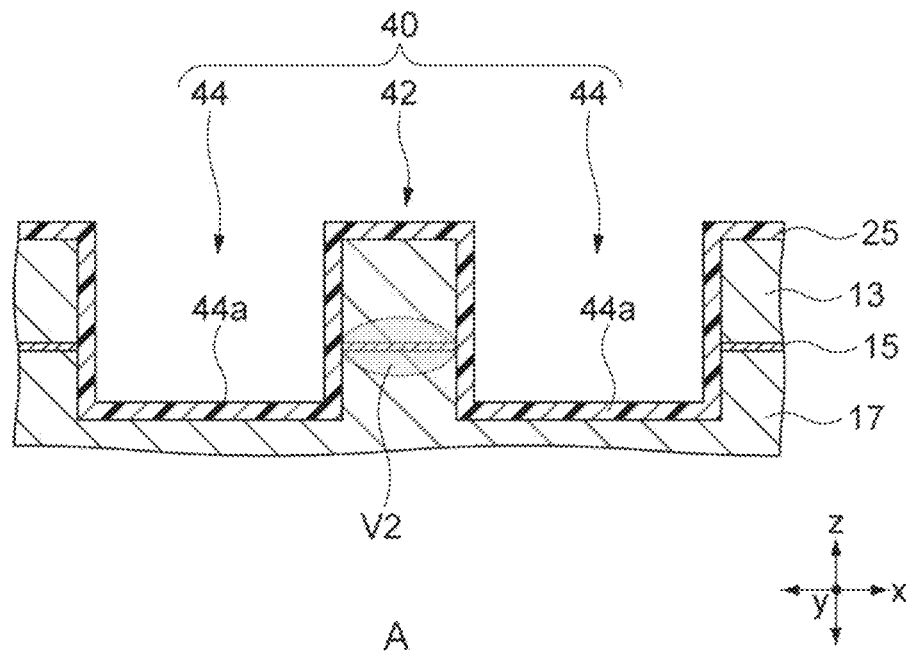
FIG. 4A is a sectional view taken along the line A-A of FIG. 3.
FIG. 4B is a sectional view taken along the line B-B of FIG. 3.
Figure 4:
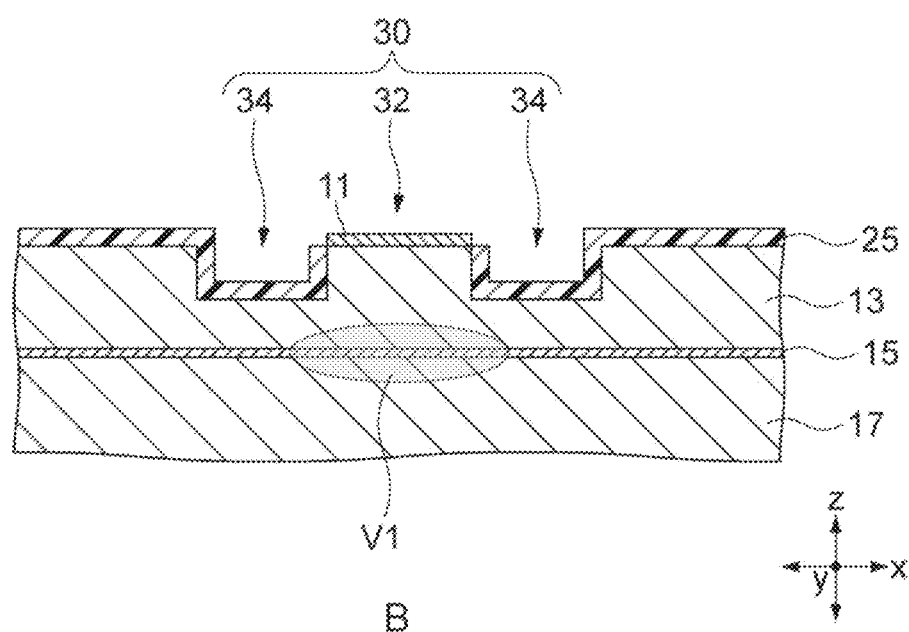

FIG. 4A is a sectional view taken along the line A-A of FIG. 3. FIG. 4B is a sectional view taken along the line B-B of FIG. 3. Note that in FIGS. 4A and 4B, the dielectric layer 25 is arranged on the upper surface of the optical device 100 but in FIGS. 1 and 3, the dielectric layer 25 is not shown.

As shown in FIGS. 1 and 3, the first electrode layer 11 has a stripe shape extending from the rear end 102 to the light-outgoing end 101 and the ridge-type waveguide structure 50 is formed as described above.

The first conduction type layer 13, the active layer 15, and the second conduction type layer 17 include the waveguide structure 50 including a first region 30 and a second region 40 separately arranged in the y direction of the longitudinal direction of the optical device 100.

As shown in FIG. 3, the first region 30 of the waveguide structure 50 has a waveguide structure arranged apart from the rear end 102 to a predetermined position in the y direction. The second region 40 of the waveguide structure 50 has a waveguide structure arranged at the region from the end of the first region 30 at a light-outgoing end to the light-outgoing end 101. In other words, the second region 40 is arranged between the first region 30 and the light-outgoing end 101.

As shown in FIG. 4B, the first electrode layer 11 forms a current injection region mainly on the first conduction type layer 13. The first region 30 of the waveguide structure 50 includes a first waveguide 32 that is the current injection region and current non-injection regions, into which no current is injected, arranged around the first waveguide 32. The first waveguide 32 is mainly formed of a ridge. The current non-injection regions are mainly first recesses 34 arranged to sandwich the first waveguide 32. In other words, the first region 30 has a so-called double ridge (w-ridge) structure.

In the first conduction type layer 13, a current is diffused from the first electrode layer 11 to the active layer 15 spreading to some extent. In the first region 30, the region of the first conduction type layer 13 (and the second conduction type layer 17) in which a current flows is referred to as the current injection region and the regions other than that are referred to as the current non-injection regions. In other words, the current injection region and the current non-injection regions form a current constriction structure. The first region 30 of the waveguide structure 50 can increase a current density. A high-output light beam is generated at a limited region shown by a symbol V1 of FIG. 4B.

A first refractive index difference is generated between a light refractive index of the current injection region (first waveguide 32) and a light refractive index of the current non-injection regions (first recesses 34). The first refractive index difference is a value calculated as an equivalent refractive index difference that is changed depending on the depths of the first recesses 34.

As shown in FIG. 4A, the second region 40 of the waveguide structure 50 includes a second waveguide 42 arranged extending from the first waveguide 32 to the light-outgoing end 101 and second recesses 44 arranged to sandwich the second waveguide 42.

The second waveguide 42 is a convex region formed of a semiconductor extended from the first waveguide 32 and has no first electrode layer 11. The depths of the second recesses 44 are deeper than the depths of the first recesses 34 of the first region 30.

In the second region 40 having the above structure, a second refractive index difference is generated between a light refractive index of the second waveguide 42 and a light refractive index of the second recesses 44. The second refractive index difference is a value calculated as an equivalent refractive index difference that is changed depending on the depths of the second recesses 44.

The depths of the first recesses 34 and the second recesses 44 are designed so that the second refractive index difference is greater than the first refractive index difference of the first region 30. As described above, since the depths of the second recesses 44 are deeper than the depths of the first recesses 34, the second refractive index difference can be designed to be greater than the first refractive index difference. Such waveguide structure 50 generates a light confinement action shown by a symbol V2 of FIG. 4A.

As shown in FIG. 4A, the depths of the second recesses 44 are typically set such that the second recesses 44 have bottom faces 44a at positions deeper than the position of the active layer 15. Thus, the difference between the first refractive index difference and the second refractive index difference can be increased.

Note that the surfaces of the first recesses 34 and the second recesses 44 are covered with the dielectric layer 25, respectively, as described above. Typically, the first recesses 34 and the second recesses 44 covered with the dielectric layer 25 are filled with an electrically conductive material including the first electrode layer 11 or other suitable material.

As described above, once the first electrode layer 11 forms a current injection region mainly on the first conduction type layer 13, light is generated in the first waveguide 32. The region close to the rear end 102 of the first waveguide 32 is a region where carriers are recombined in the active layer 15 to generate light (spontaneous emission light). Hereinafter, this region is referred to as an "LED region" for convenience. On the other hand, the region close to the second waveguide 42 of the first waveguide 32 is a region where the carriers are recombined to generate the spontaneous emission light and the spontaneous emission light is amplified. Hereinafter, this region is referred to as a "light amplifying region" for convenience.

Light generated at the LED region of the first waveguide 32 propagates through the first waveguide 32. The light traveling toward the rear end 102 is reflected by the dielectric film 21 arranged on the rear end 120, and travels toward the light-outgoing end 101. The light traveling toward the light-outgoing end 101 enters the second waveguide 42, and travels through the second waveguide 42 toward the light-outgoing end 101. Since the second refractive index difference in the second region 40 is greater than the first refractive index difference in the first region 30, a light confinement action in the second region is promoted. The light traveling through the second waveguide 42 is outgoing from the light-outgoing end 101.

Here, in the laser diode (LD), the generated light is reflected repeatedly by the end face, light having a specific wavelength is amplified (laser oscillation), and coherence light having a narrow spectrum width (laser light) is emitted. In contrast, in the SLD, the generated light is not reflected by the end face of the light-outgoing side, and low coherence light having a broad spectrum is emitted.

Accordingly, the optical device 100 does not use the light reflected by the light-outgoing end 101. If the light reflected by the light-outgoing end 101 reaches the first waveguide 32 via the second waveguide 42, laser oscillation occurs to be laser light. For this reason, the optical device 100 should have a structure that the light reflected by a light reflection end 101 does not reach the first waveguide 32.

1.2) Structure of Second Waveguide

Figure 5:
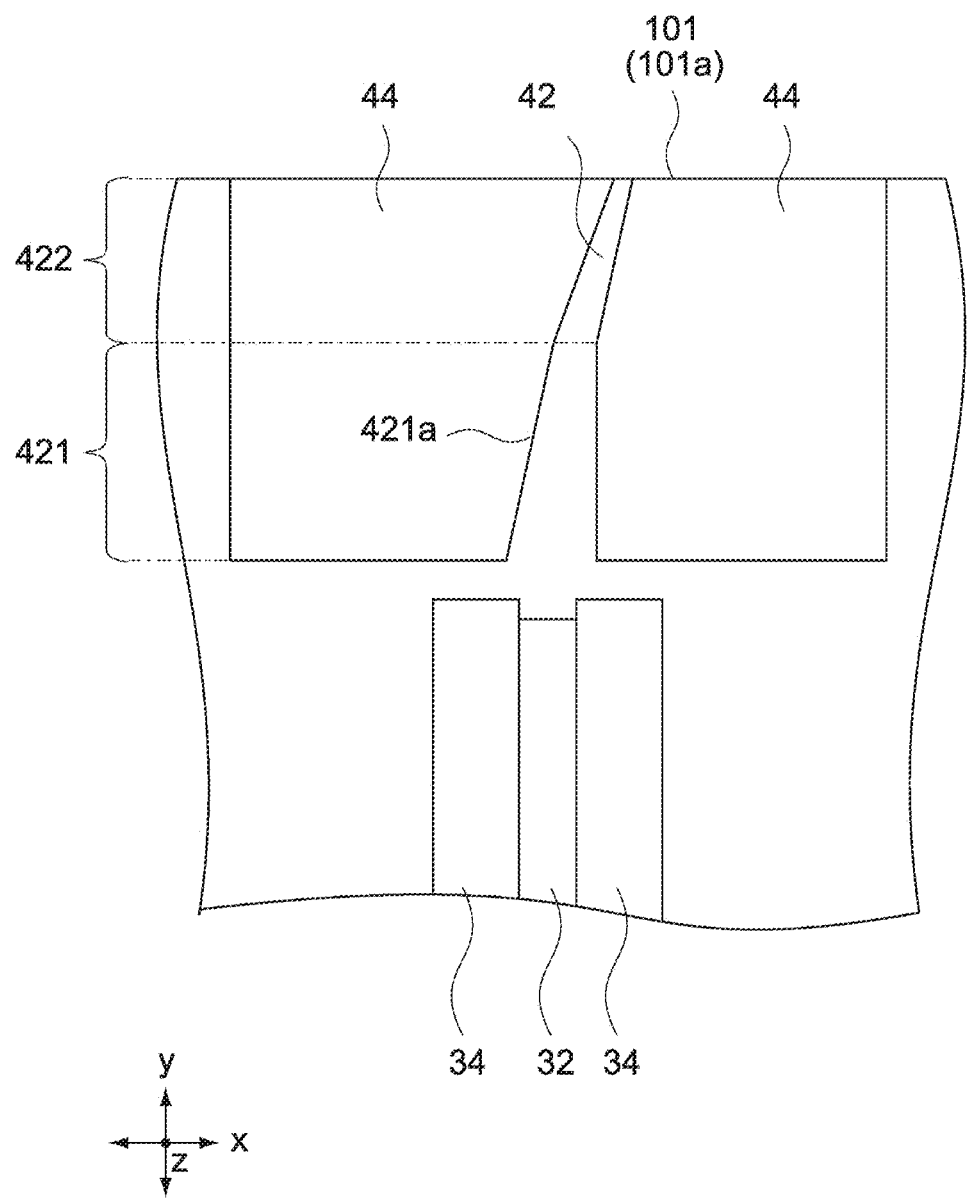
FIG. 5 is a plan view mainly showing a second region of a waveguide structure in an enlarged state.
Figure 6:
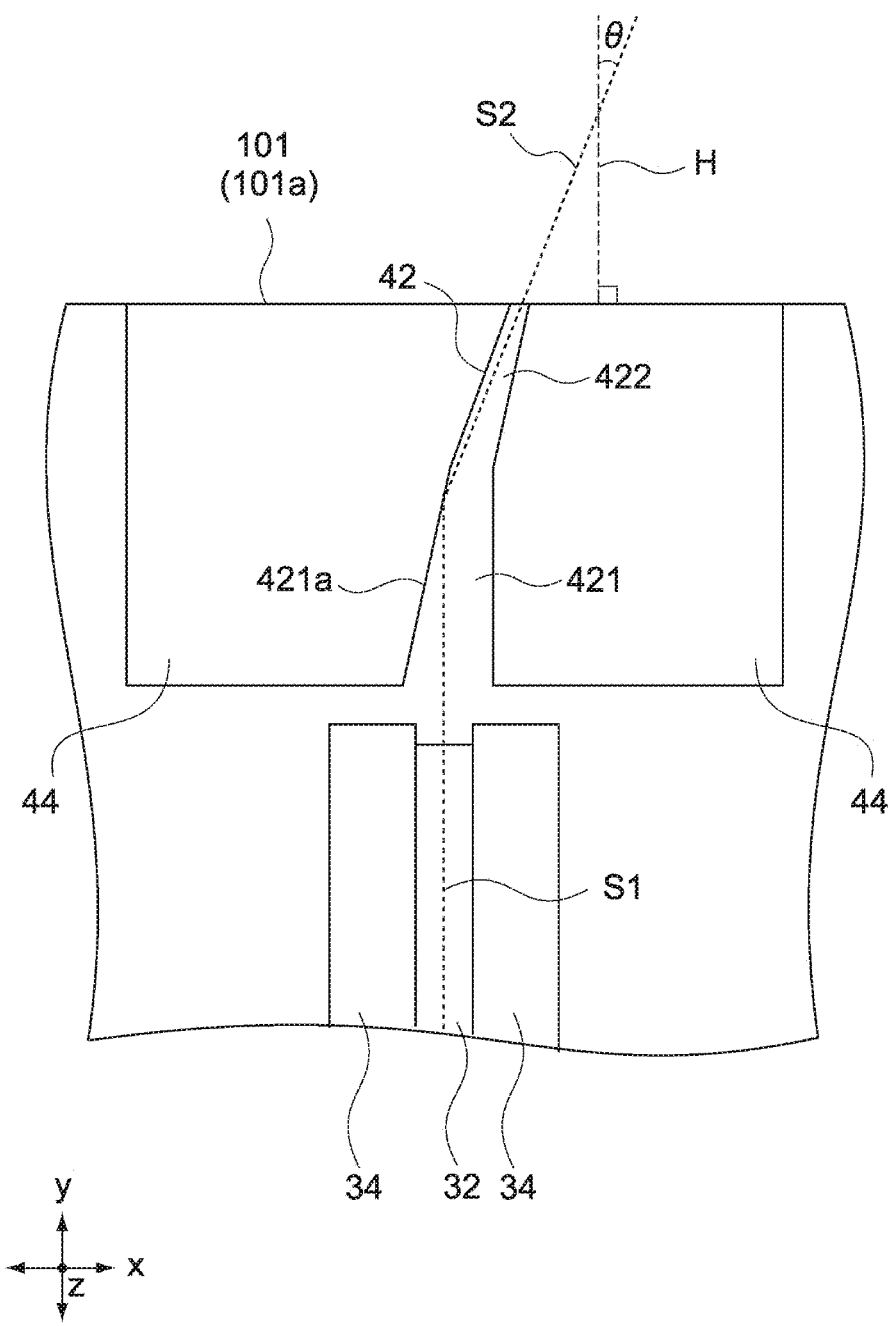
FIG. 6 is a schematic view showing an optical axis of light travelling a first waveguide and a second waveguide.
Figure 7:
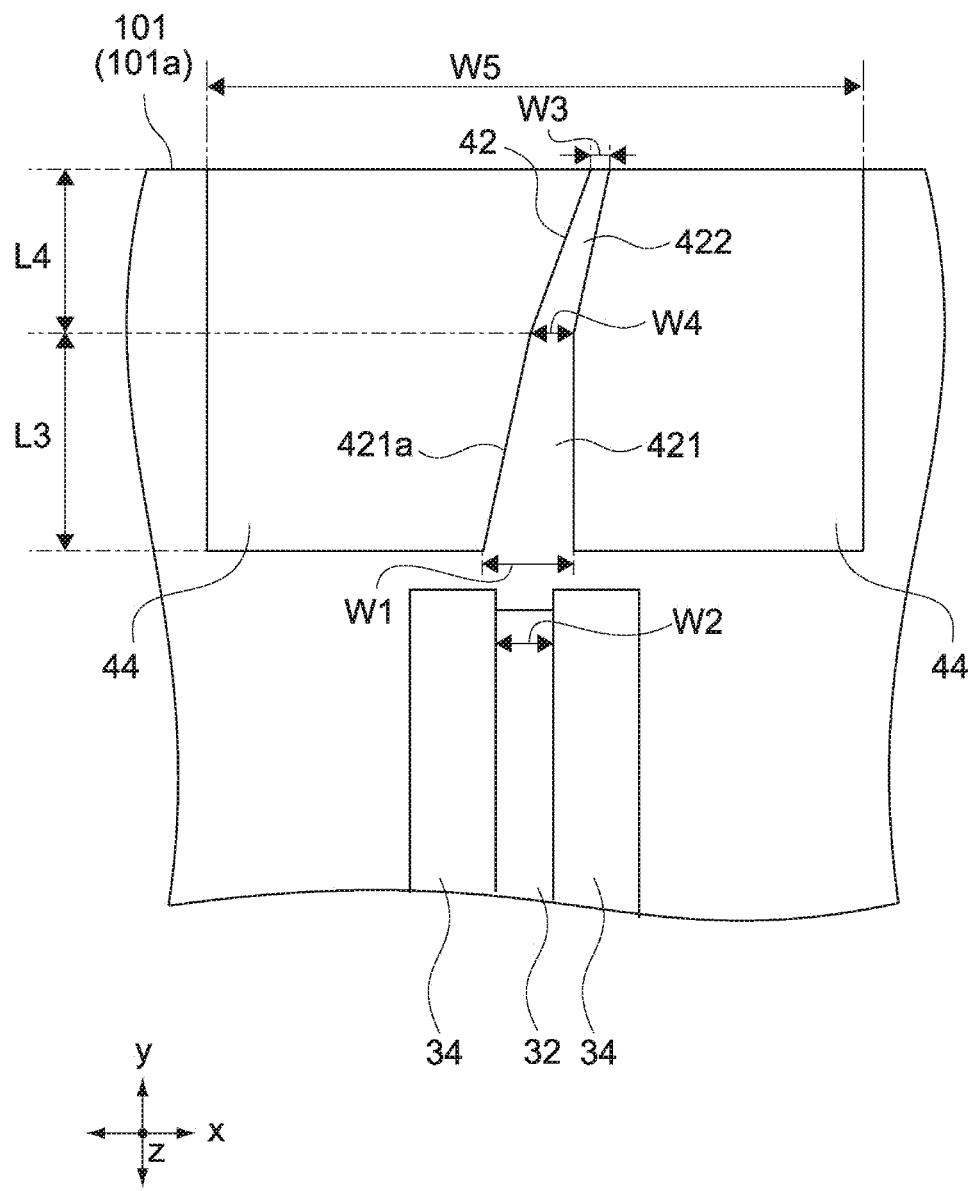
FIG. 7 is a view showing a size of each region of the optical device.

FIG. 5 is a plan view showing the structure of the second waveguide 42 and is an enlarged view of FIG. 3. FIG. 6 is a schematic view showing an optical axis of light propagating the second waveguide 42. FIG. 7 is a view showing a size of each region of the second waveguide 42. Note that the dielectric film 21 arranged at the end face of the light-outgoing end 101 (light-outgoing end face 101a) is not shown.

As shown in FIGS. 5 to 7, the second waveguide 42 includes a reflection structure 421 and a taper structure 422. The reflection structure 421 and the taper structure 422 have the same cross-sectional structure as shown in FIG. 4A.

The reflection structure 421 is positioned at the first waveguide 32 side of the second waveguide 42 and slopes the optical axis of light entered from the first waveguide 32 side. In FIG. 6, the optical axis of light outgoing from the first waveguide 32 is shown as an optical axis S1, and the optical axis of light reflected by the reflection structure 421 is shown as an optical axis S2. As shown in FIG. 6, the reflection structure 421 slopes the optical axis S1 toward the optical axis S2.

Specifically, the reflection structure 421 may include a reflection face 421a having the intersection point with the optical axis S1 (extension of the center line of the first waveguide 32). The reflection face 421a is an interface between the second waveguide 42 and the second concave portion 44. Light entered to the reflection face 421a due to the refractive index difference (second refractive index difference) between the second waveguide 42 and the second concave portion 44 is reflected.

As shown in FIG. 7, where the width of the end of the reflection structure 421 at the first region side is denoted as a width W1 and the width of the end of the first waveguide 32 at the second region 40 side is denoted as a second width W2, the width W1 is desirably wider than the width W2. This is because the total amount of light outgoing from the first waveguide 32 can be lead to the second waveguide 42.

The taper structure 422 of the second waveguide 42 is positioned at the light-outgoing end 101 side, and decreases a size of a beam spot of light entered from the reflection structure 421. Specifically, the taper structure 422 has a width gradually narrowing toward the light-outgoing end 101. Light entered to the taper structure 422 is reflected by the interface between the taper structure 422 and the second concave portion 44, and is collected around the optical axis S2.

As shown in FIG. 7, where the width of the end of the taper structure 422 at the light reflection end 101 side is denoted as a width W3 and the width of the end of the taper structure 422 at the reflection structure 421 side is denoted as a width W4, the width W3 is narrower than the width W4 and is narrower than the width W2. The width W4 may be similar to the width W2 or may be narrower than the width W2.

As described above, light outgoing from the first waveguide 32 is sloped from an extension direction (optical axis S1) of the first waveguide 32 by the reflection structure 421. Accordingly, even if the extension direction of the first waveguide 32 is orthogonal to the end face (light-outgoing end face 101a) of the light-outgoing end 101, the optical axis S2 of light outgoing from the optical device 100 is sloped with respect to the direction orthogonal to the light-outgoing end face 101a.

As a result, light reflected by the light-outgoing end face 101a is prevented from entering into the second waveguide 42, i.e., the laser oscillation of the reflected light is prevented. As shown in FIG. 6, where the line perpendicular to the light-outgoing end face 101a is a line H, the optical axis S2 is sloped with respect to the line H, and the sloped angle ($\theta$ in FIG. 6) is preferably 3 degrees or more and 15 degrees or less, more preferably 5 degrees or more and 10 degrees or less, typically 7.5 degrees.

If the light-outgoing angle $\theta$ is smaller than 3 degrees, the reflected light from the light-outgoing end face 101a returns to the first waveguide 32, and laser oscillation may occur. The coefficient of coupling may be roughly $10^{-5}$. Because if the light-outgoing angle $\theta$ exceeds 15 degrees, the angle is close to the total reflection and the amount of outgoing light is decreased. Note that a light reflection direction of the reflection structure 421 is preferably coincide with the direction of the optical axis of the light outgoing from the light-outgoing end face 101a.

1.3) Structure of First Waveguide

As shown in FIG. 3, the first waveguide 32 is extended lineally in a direction in parallel with the longitudinal direction (Y direction) of the optical device 100, and the extension of the center line of the first waveguide 32 is orthogonal to the light-outgoing end face 101a and the rear end face 102a.

As described above, since the second waveguide 42 has the reflection structure 421 that slopes the optical axis of light outgoing from the first waveguide 32, the first waveguide 32 can be extended lineally in the direction in parallel with the longitudinal direction (Y direction) of the optical device 100.

With this structure, almost all amount of light that reaches from the first waveguide 32 to the rear end face 102a and is reflected by the rear end face 102a is reflected toward the first waveguide 32. Thus, comparing with the case that the extension of the center line of the first waveguide 32 is sloped with respect to the rear end face 102a, the amount of light outgoing from the optical device 100 can be increased.

In addition, with the linear first waveguide 32, the waveguide loss in the first waveguide 32 can be prevented. In the related art of the SLD, since the optical axis of the outgoing light of the SLD is sloped with respect to the light-outgoing end to prevent the laser oscillation, an extended curved waveguide corresponding to the first waveguide 32 is used. In this case, due to the curved waveguide, light leakage (waveguide loss) occurs.

Figure 8:
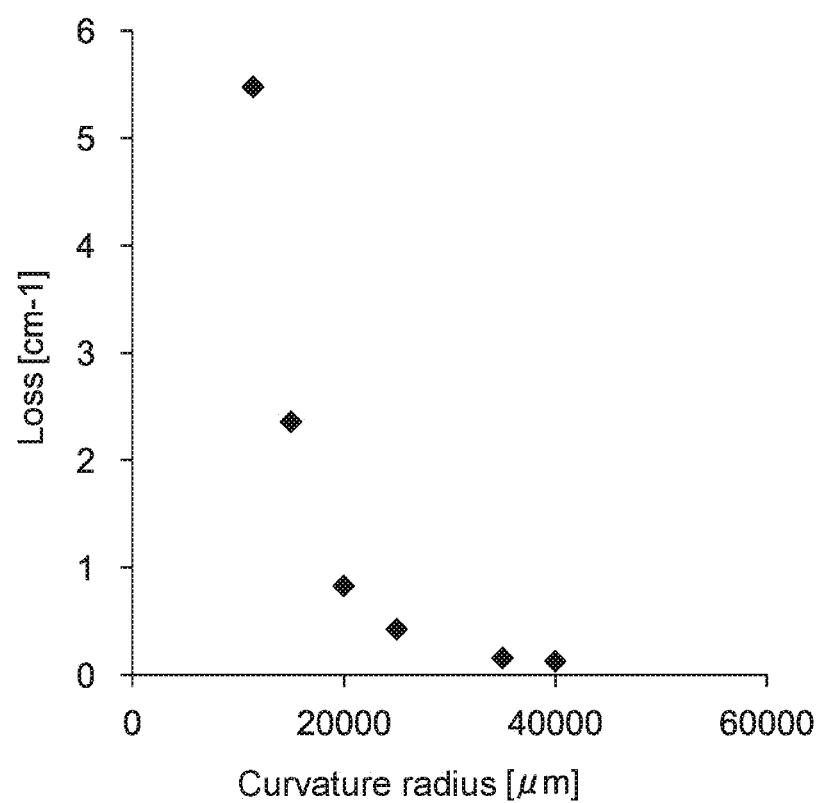
FIG. 8 is a graph showing a relationship between a curvature radius of the first waveguide and a waveguide loss.

FIG. 8 is a graph showing a relationship between a curvature of the waveguide and the waveguide loss. As shown in FIG. 8, the curved waveguide generates the waveguide loss. The smaller the curvature radius is, the greater the waveguide loss is.

In contrast, since the first waveguide 32 is linear according to this embodiment, the waveguide loss due to the shape of the waveguide is not generated and the amount of light outgoing from the optical device 100 can be increased.

1.4) Size of Optical Device

Figure 9:
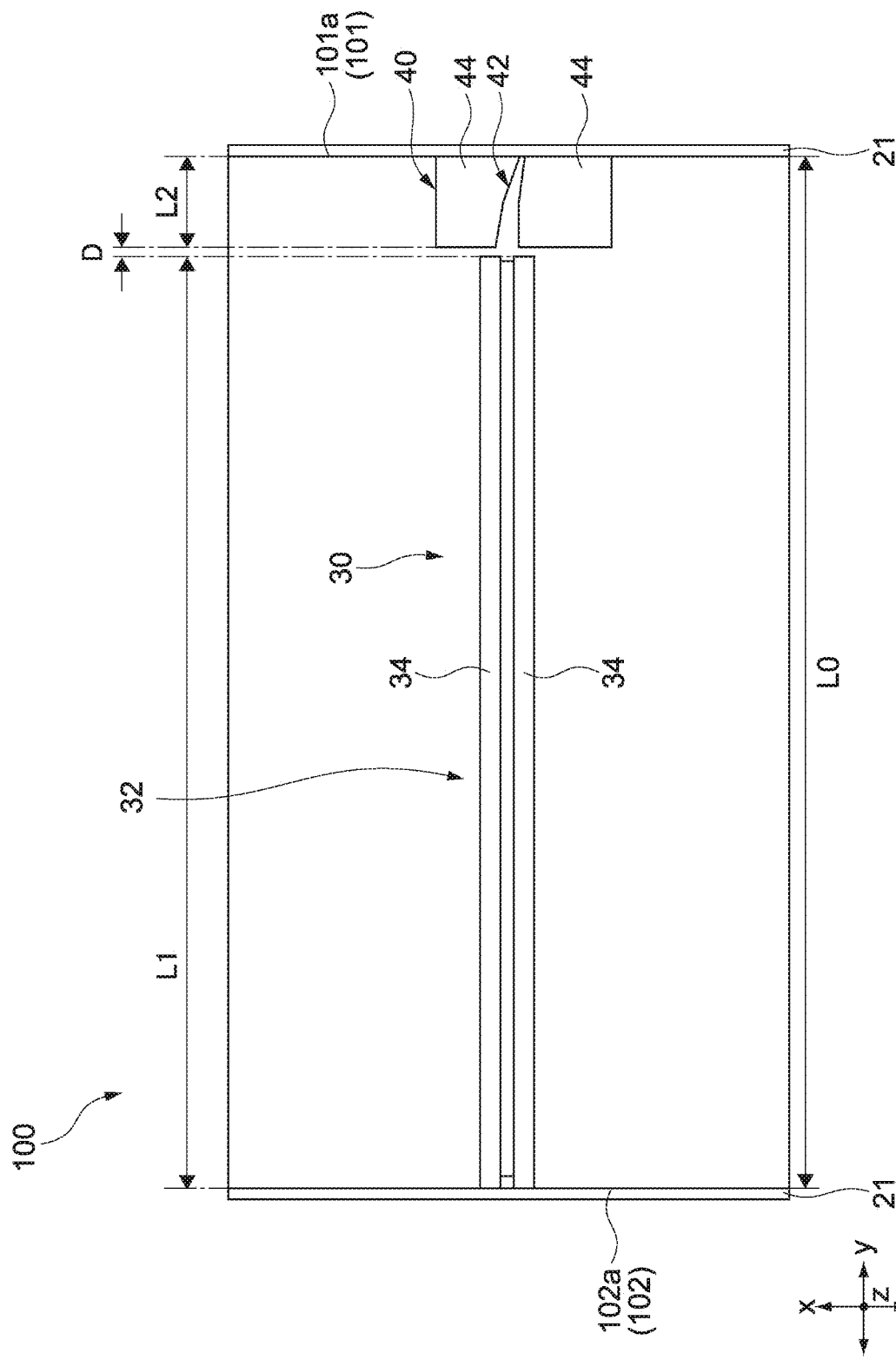
FIG. 9 is a view showing a size of each region of the optical device.

FIG. 9 is a schematic view showing a size of each region of the optical device 100. A total length L0 of (a semiconductor device of) the optical device 100 is, for example, 1000 µm or more and 4000 µm or less, typically 2200 µm. The total length L0 is not limited to the range. Note that the total length L0 may be the length including the thicknesses of the dielectric films 21 at both ends.

The width W2 of the first waveguide 32 (see FIG. 7) is 3 µm or more and 12 µm or less and is substantially uniform at any position in the longitudinal direction. However, the width W2 may not necessarily be uniform. More preferably, the width W2 is 5 µm or more and 10 µm or less, for example 6 µm, in order to achieve a high-output.

A length L2 of the second waveguide 42 in the y direction of the optical device 100 is designed such that the angle of light transmitting in the second waveguide 42 (angle between the light and the y axis viewed from the z direction) is smaller than the critical angle determined on the basis of the second refractive index difference. The length L2 is, for example, 25 µm or more and 300 µm or less, typically, 246 µm.

A length L3 (see FIG. 7) of the reflection structure 421 is, for example, 10 µm or more and 300 µm or less, typically, 125 µm. A length L4 of the taper structure 422 is, for example, 10 µm or more and 300 µm or less, typically, 121 µm.

A width W1 of the end at a first region 30 side of the second waveguide 42 is, for example, 4 µm or more and 15 µm or less, preferably, 6 µm or more and 12 µm or less. The width W1 is typically 7 µm.

A width W3 of the end at the light-outgoing end 101 of the second waveguide 42 is, for example, 1 µm or more and 10 µm or less, preferably, 2 µm or more and 8 µm or less. The width W3 is not especially limited and may be designed to have a necessary beam spot size. The width W3 is typically 3.4 µm.

The relationship among the widths W1, W2, and W3 holds W1>W2>W3. In particular, since the width W1 is wider than the end width of the second region 40 side of the first waveguide 32 (here, W2), all amount of light generated and transmitted in the first waveguide 32 can be reliably led to the second waveguide 42 and a light loss can be suppressed.

Note that, as shown in FIG. 7, an entire width W5 of the second recesses 44 (or a surface area of the second recesses 44 viewed from the z direction) is set as appropriate. As long as an adequate difference between the first refractive index difference and the second refractive index difference is provided, the surface area of the second recesses 44 is not limited. The width W5 may be the same as the entire width of the first recesses 34 of the first region 30.

In addition, as shown in FIG. 9, a predetermined space D is arranged between the first region 30 and the second region 40 but may not be present (D=0). Furthermore, the second region 40 and the light-outgoing end face 101a may be spaced from each other. This is for forming a cleavage buffer in a case where the light-outgoing end face 101a is formed by cleavage. The space may be 5 μm, for example.

1.3) Illustrative Materials of Components of Optical Device and Production Method Thereof Next, a method of producing the optical device 100 (SLD) according to this embodiment will be described. A method of producing red SLD, a method of producing a green SLD, and a method of producing a blue SLD will be described separately. The production method and the materials used described below are only typical examples and are not limited thereto.

1.3.1) Method of Producing Red SLD

Figure 10:
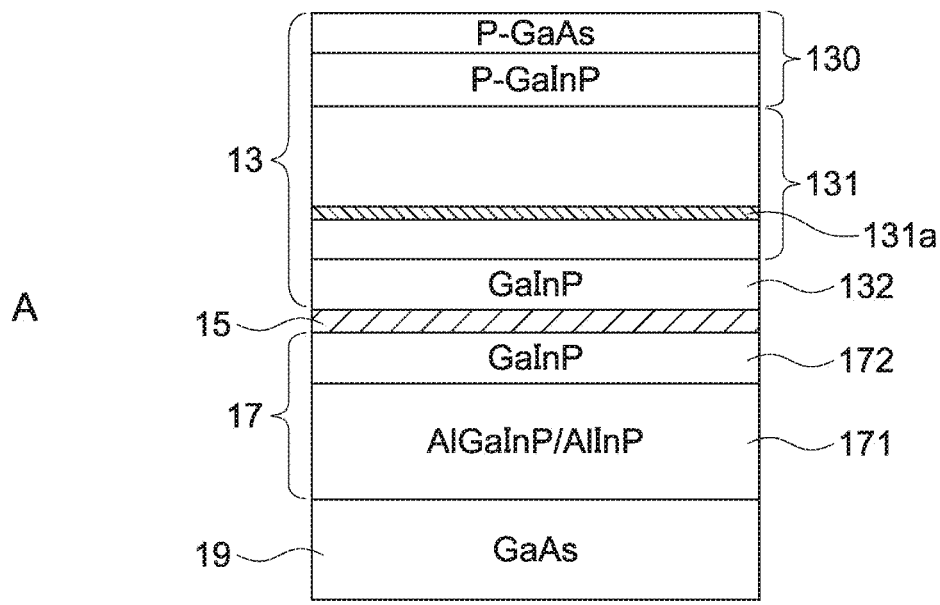
FIG. 10A is a cross-sectional view showing semiconductor layers for describing a method of producing a red SLD.
FIG. 10B is a cross-sectional view showing a cross section of a first region of a device on which a first electrode layer is formed after a dielectric layer is formed.
Figure 10:
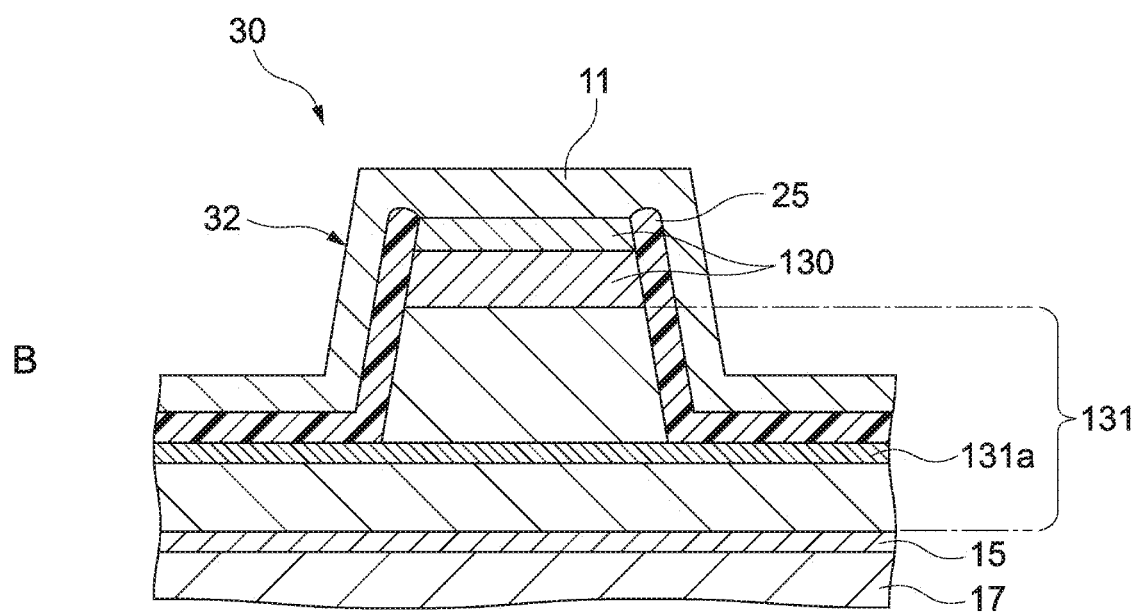

A method of producing a red SLD will be described. FIG. 10A is a cross-sectional view showing semiconductor layers of the optical device 100 of the red SLD.

As a substrate 19 of the semiconductor, a GaAs substrate is used. On the GaAs substrate (at this point, wafer), the following crystal structure is formed by the MOCVD (Metal Organic Chemical Vapor Deposition) method.

An Si-doped n-type clad layer 171 formed of $Al_{0.5}In_{0.5}P$ is grown to have a thickness of about 3 μm. On the n-type clad layer, a guide layer 172 formed of $Ga_xIn_{1-x}P$ is grown to have a thickness of about 20 nm. An active layer 15 formed of $Ga_xIn_{1-x}P$ or $(Al_xGa_{1-x})_{0.5}In_{0.5}P$ is grown. The active layer 15 generally has a multiquantum well structure, and the width of a well and the number of wells are not especially limited. For example, the thickness of a well of the active layer 15 is about 80 angstrom.

On the active layer 15, a guide layer 132 formed of $Ga_xIn_{1-x}P$ is grown to have a thickness of about 40 nm. A Mg-doped p-type clad layer 131 formed of $Al_{0.5}In_{0.5}P$ is grown thereon.

As the material of the clad layer, a semiconductor having a composition, e.g., AlGaInP, may be used. The clad layer has a film thickness of, for example, about 1.5 μm.

During the growth of the p-type clad layer 131, an etching-stop layer 131a formed of $Ga_xIn_{1-x}P$ is formed. The etching-stop layer 131a may be formed of a material resistant to wet etching with ammonia hydrogen peroxide water or the like. The etching-stop layer 131a has a film thickness of, for example, about 5 nm. Note that the etching-stop layer 131a is not shown in FIG. 1, etc.

On the p-type clad layer 131 including the etching-stop layer 131a, a Mg-doped GaInP layer is grown. The Mg-doped GaAs layer is grown to form a contact layer 130.

Next, on regions on the wafer corresponding to the light-outgoing end face 101a and the rear end face 102a of the optical device 100, window regions (not shown) are formed. This is for suppressing light absorption as low as possible. For the formation of the window regions, a technique of diffusing impurities (for example, Zn) into the semiconductor layer is used, for example. These window regions are not necessarily present. Alternatively, the window region may be formed on either one of the light-outgoing end face 101a and the rear end face 102a.

Next, the second region 40 (second waveguide 42 and second recesses 44) of the waveguide structure 50 is formed. Specifically, $SiO_2$ mask openings corresponding to the shapes of the second recesses 44 are formed at the position corresponding to the second region 40 by photolithography. Via the openings, etching is performed by dry etching. By the dry etching treatment, the n-type clad layer 171 is etched to half. With the etching treatment, as described above, an etching depth is controlled on the basis of the equivalent refractive index difference between the second waveguide 42 and the second recesses 44 therearound.

Next, the first region 30 (first waveguide 32 and first recesses 34) of the waveguide structure 50 is formed. For example, the first region 30 is formed by the steps of photolithography and etching. In the etching step, dry etching is performed so as not to exceed the etching-stop layer 131a. Also, in the etching step, the semiconductor layer remaining on the etching-stop layer 131a is removed by wet etching with ammonia hydrogen peroxide water or the like. Thus, the first region 30 is formed.

Next, the dielectric layer 25 (see FIGS. 4A and 4B) is formed. Specifically, the dielectric layer 25 is formed on the ridge excluding the top of the ridge by a film-forming technique and photolithography. The dielectric layer 25 is formed to cover the wall face of the ridge and the inner faces of the first recesses 34 and the second recesses 44.

The material of the dielectric layer 25 is $SiO_2$, for example. The material of the dielectric layer 25 may be Si, SiN, $Al_2O_3$, $Ta_2O_5$, AlN, or the like. The film of the dielectric layer 25 may be a single layer film or a multi-layer film. The thickness of the dielectric layer 25 is not limited as long as the first recesses 34 and the second recesses 44 are protected.

FIG. 10B is a cross-sectional view showing the cross section of the first region 30 of the device on which the first electrode layer 11 is formed after the dielectric layer 25 is formed. The first electrode layer 11 is formed by a film-forming technique and photolithography. The first electrode layer 11 is formed at least on the top of the ridge but may be formed continuously on the wall face and the like of the ridge, as shown in FIG. 7B. The materials of the first electrode layer 11 are Ti/Pt/Au from a semiconductor side, for example.

Note that, as shown in FIGS. 4A and 4B, the shape of the cross section (cross section of z-x plane) of the ridge is a rectangle. However, in fact, the shape is a trapezoid, in which the width of the upper contact layer is narrower, for example, as shown in FIG. 10B. The cross section of the ridge may be a rectangle or an inverted trapezoid (trapezoid upside down).

The wafer, i.e., the GaAs substrate (substrate 19), is abraded and thinned to a predetermined thickness and the second electrode layer 12 is formed on the back surface of the wafer (see FIG. 1). The second electrode layer 12 includes, for example, AuGe/Ni/Au from the semiconductor side.

After the second electrode layer 12 is formed, the wafer is worked by, for example, cleavage and is formed into a chip for a unit of an optical device. Thus, the light-outgoing end face 101a of the optical device 100 is formed. On the light-outgoing end face 101a, the dielectric film 21 is formed for the purpose of protection and a decrease of the reflectance. The dielectric film 21 is formed by, for example, sputtering or deposition. Examples of the materials of the dielectric film 21 include $SiO_2$, $Al_2O_3$, $Ta_2O_5$, $TiO_2$, and the like.

In order to decrease the coefficient of coupling for the waveguide, the reflectance of the light-outgoing end 101 is set to 0.3% or less. On the other hand, the reflectance of the rear end 102 is set to approximately 95% or more. The reflectances of the light-outgoing end 101 and the rear end 102 are not limited to the above-described numerical values. A lower reflectance may be set on the light-outgoing end 101 and a higher reflectance may be set on the rear end 102.

The chip produced as described above is mounted on a package used in an LD (Laser Diode) or another predetermined jig. A solder material for mounting is, for example, an AuSn alloy, Sn, silver paste, or the like. The chip may be mounted on any of a p side and an n side of the semiconductor device as a package side. In order to efficiently exhaust heat, the chip is desirably mounted on the p side as the package side.

The mounted optical device 100 is connected to a terminal for power feeding via an Au wire bond. As necessary, components for protecting the optical device 100 are mounted, and the product is thus manufactured.

Figure 11:
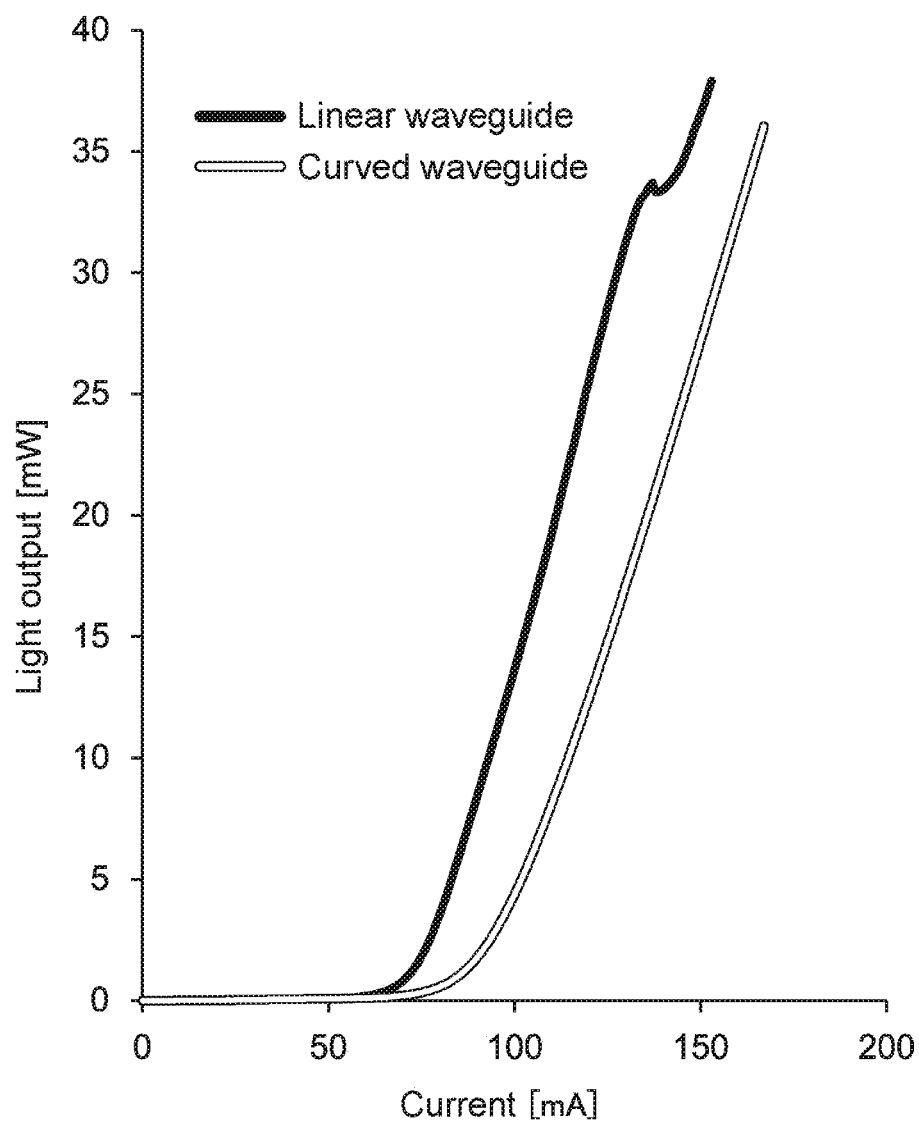
FIG. 11 is a graph showing a difference of a light output due to a shape of the first waveguide of the optical device.

FIG. 11 is a graph showing output properties of the optical device 100. In FIG. 11, the black line denotes the output properties of the optical device 100 (including the linear first waveguide 32) produced as described above. In addition, the white line denotes the output properties of the optical device including the curved waveguide for comparison.

FIG. 11 shows that the optical device 100 has the higher light output and the lower waveguide loss as compared with the optical device including the curved waveguide. In addition, slope efficiency (percentage of light output to injected current) is improved by 37% at room temperature.

1.3.2) Method of Producing Green SLD and Blue SLD

Next, a method of producing a green SLD and a blue SLD will be described. Here, description of the method similar to the method of producing the red SLD will be simplified or omitted and different points will be mainly described.

The method of producing the green SLD and the blue SLD is different from the method of producing the red in that no etching-stop layer 131a is arranged. The etching depth is controlled on a basis of time. As the semiconductor material of the green SLD, a GaN based material is used. In this case, since wet etching may not often be performed, no etching-stop layer 131a is provided.

Other than the above, there may be used a method of detecting an etching stop position by irradiating a crystal multi-layer structure with laser by utilizing the fact that difference of the film thickness of the multi-layer structure before and after etching periodically changes the reflectance of laser light.

The respective layers of the semiconductor layers are formed of, for example, the following materials.

Substrate: GaN
Active layer: INGaN
Guide layer: GaN or INGaN
Clad layer: InAlGaN or AlGaN
Contact layer: GaN or AlGaN The structure and the method of producing the LD disclosed in, for example, Japanese Patent Application Laid-open No. 2012-174868 are suitable as the structure and the method of producing the "first region 30" of the green SLD. The structure and the method of producing the LD disclosed in, for example, Japanese Patent Application Laid-open No. 2010-129763 are suitable as the structure and the method of producing the blue SLD.

Note that the green SLD and the blue SLD are distinguished by a difference of doped impurities and a difference of the amount thereof.

2. Optical Device According to Other Embodiments

In the following description, other embodiments of the optical device 100 will be described. In the description below, the components of the optical device 100 according to the embodiment are denoted by the same reference signs, and description thereof will be omitted or simplified and different points will be mainly described.

2.1) Other Embodiment 1

Figure 12:
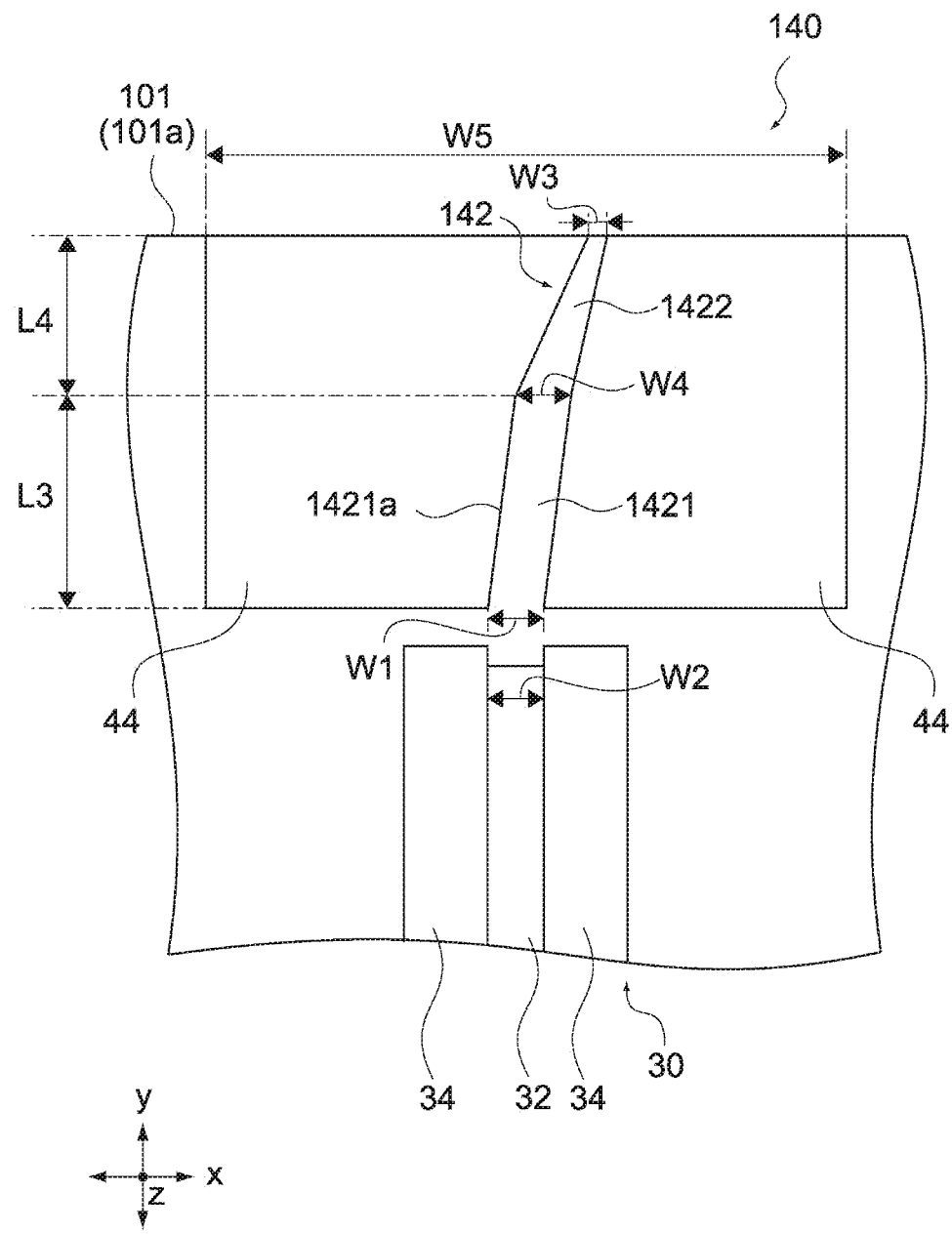
FIG. 12 is a plan view mainly showing a second region according to other embodiment 1.

FIG. 12 is a plan view mainly showing a second region 140 of the optical device 100 according to other embodiment 1. As shown in FIG. 12, the second region 140 includes the second waveguide 142. The second waveguide 142 has the structure similar to the second waveguide 42 according to the above-described embodiments except the shape, and includes a reflection structure 1421 and a taper structure 1422.

The reflection structure 1421 is positioned at the first waveguide 32 side of the second waveguide 142 and slopes the optical axis of light entered from the first waveguide 32 side. Specifically, the reflection structure 421 may include a reflection face 1421a having the intersection point with the optical axis of the first waveguide 32 (extension of the center line of the first waveguide). In addition, a wall face of the reflection structure 1421 may be in parallel with that of the reflection face 1421a opposite thereto unlike the above-described embodiments.

As shown in FIG. 12, where the width of the end of the reflection structure 1421 at the first region side 30 is denoted as a width W1 and the width of the end of the first waveguide 32 at a second region 140 side is denoted as a second width W2, the width W1 may be the same as the width W2. Also, the width W1 may be wider than the width W2.

The taper structure 1422 of the second waveguide 142 is positioned at the light-outgoing end 101 side, and decreases a size of a beam spot of light entered from the reflection structure 1421. Specifically, the taper structure 1422 has a width gradually narrowing toward the light-outgoing end 101. Light entered to the taper structure 1422 is reflected by the interface between the taper structure 1422 and the second concave portion 44, and is collected.

As shown in FIG. 12, where the width of the end of the taper structure 1422 at the light reflection end 101 side is denoted as a width W3 and the width of the end of the taper structure 1422 at the reflection structure 1421 side is denoted as a width W4, the width W3 is narrower than the width W4 and is narrower than the width W2. The width W4 may be similar to the width W2 or may be narrower than the width W2.

As described above, light outgoing from the first waveguide 32 is sloped from an extension direction of the first waveguide 32 by the reflection structure 1421. Accordingly, even if the extension direction of the first waveguide 32 is orthogonal to the light-outgoing end face 101a, the optical axis of light outgoing from the optical device 100 is slope with respect to the direction orthogonal to the light-outgoing end face 101a.

As a result, light reflected by the light-outgoing end face 101a is prevented from entering into the second waveguide 142, i.e., the laser oscillation of the reflected light is prevented. A slope of an optical axis of light outgoing from the second waveguide 142 toward the line perpendicular to the light-outgoing end face 101a is preferably 3 degrees or more and 15 degrees or less.

2.2) Other Embodiment 2

Figure 13:
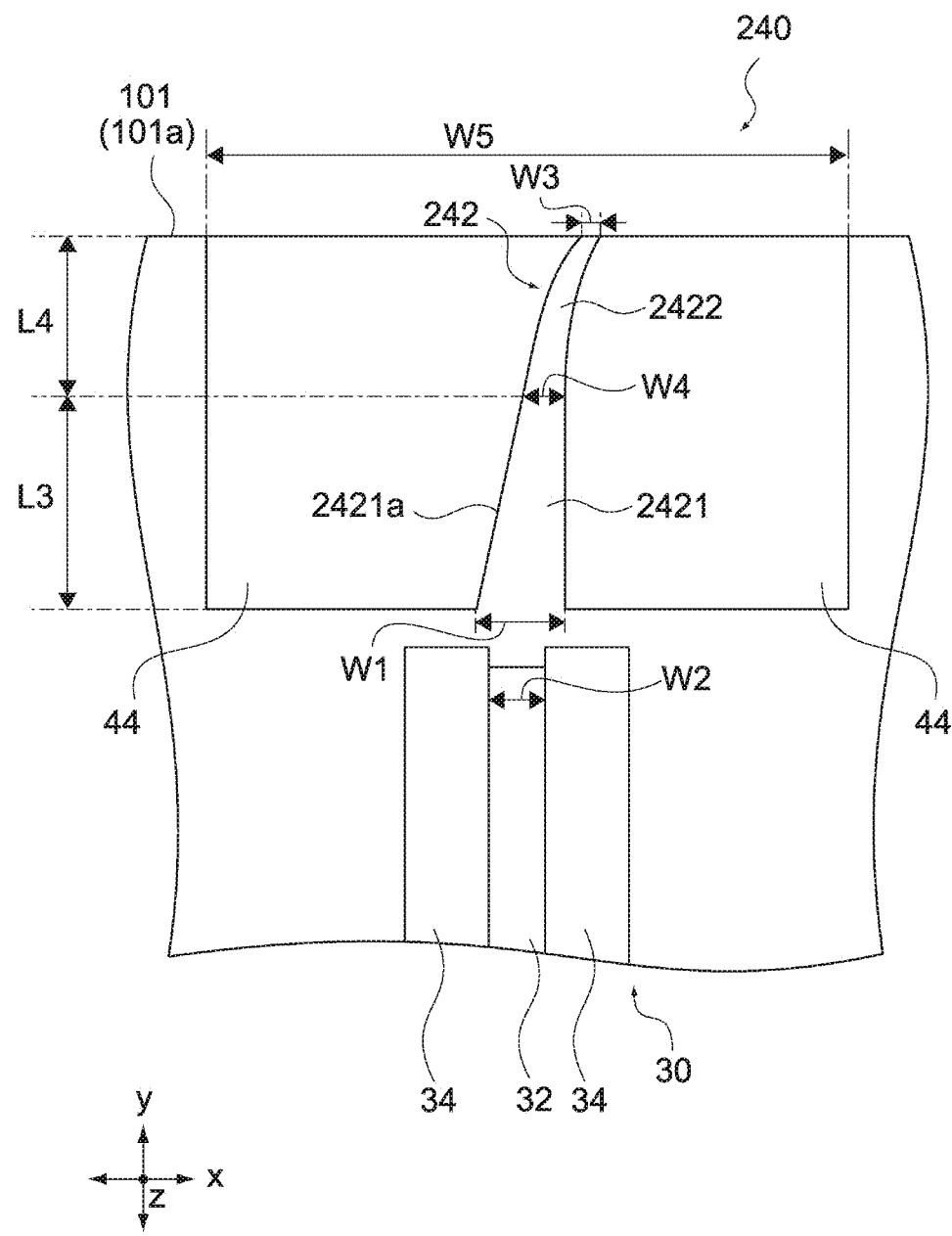
FIG. 13 is a plan view mainly showing a second region according to other embodiment 2.

FIG. 13 is a plan view mainly showing a second region 240 of the optical device 100 according to other embodiment 2. As shown in FIG. 13, the second region 240 includes the second waveguide 242. The second waveguide 242 has the structure similar to the first waveguide 42 according to the above-described embodiments except the shape, and includes a reflection structure 2421 and a taper structure 2422.

The reflection structure 2421 is positioned at the first waveguide 32 side of the second waveguide 242 and slopes the optical axis of light entered from the first waveguide 32 side. Specifically, the reflection structure 2421 may include a reflection face 2421a having the intersection point with the optical axis of the outgoing light of the first waveguide 32 (extension of the center line of the first waveguide).

As shown in FIG. 13, where the width of the end of the reflection structure 2421 at the first region side 30 is denoted as a width W1 and the width of the end of the first waveguide 32 at the second region 240 side is denoted as a second width W2, the width W1 may be wider than the width W2.

The taper structure 2422 of the second waveguide 242 is positioned at the light-outgoing end 101 side, and decreases a size of a beam spot of light reflected from the reflection structure 2421. Specifically, the taper structure 2422 has a width gradually narrowing toward the light-outgoing end 101. Light entered to the taper structure 2422 is reflected by the interface between the taper structure 2422 and the second concave portion 44, and is collected.

The taper structure 2422 may have an arc-shaped wall face unlike the above-described embodiments. Also, one part of the taper structure 2422 may be linear and the other part may be arc-shaped.

As shown in FIG. 13, where the width of the end of the taper structure 2422 at the light reflection end 101 side is denoted as a width W3 and the width of the end of the taper structure 2422 at the reflection structure 2421 side is denoted as a width W4, the width W3 is narrower than the width W4 and is narrower than the width W2. The width W4 may be similar to the width W2 or may be narrower than the width W2. The width W4 narrower than the width W1 or may be similar to the width W1.

As described above, light outgoing from the first waveguide 32 is sloped from an extension direction of the first waveguide 32 by the reflection structure 2421. Accordingly, even if the extension direction of the first waveguide 32 is orthogonal to the light-outgoing end face 101a, the optical axis of light outgoing from the optical device 100 is sloped with respect to the direction orthogonal to the light-outgoing end face 101a.

As a result, light reflected by the light-outgoing end face 101a is prevented from entering into the second waveguide 242, i.e., the laser oscillation of the reflected light is prevented. A slope of an optical axis of light outgoing from the second waveguide 242 toward the line perpendicular to the light-outgoing end face 101a is preferably 3 degrees or more and 15 degrees or less.

2.3) Other Embodiment 3

Figure 14:
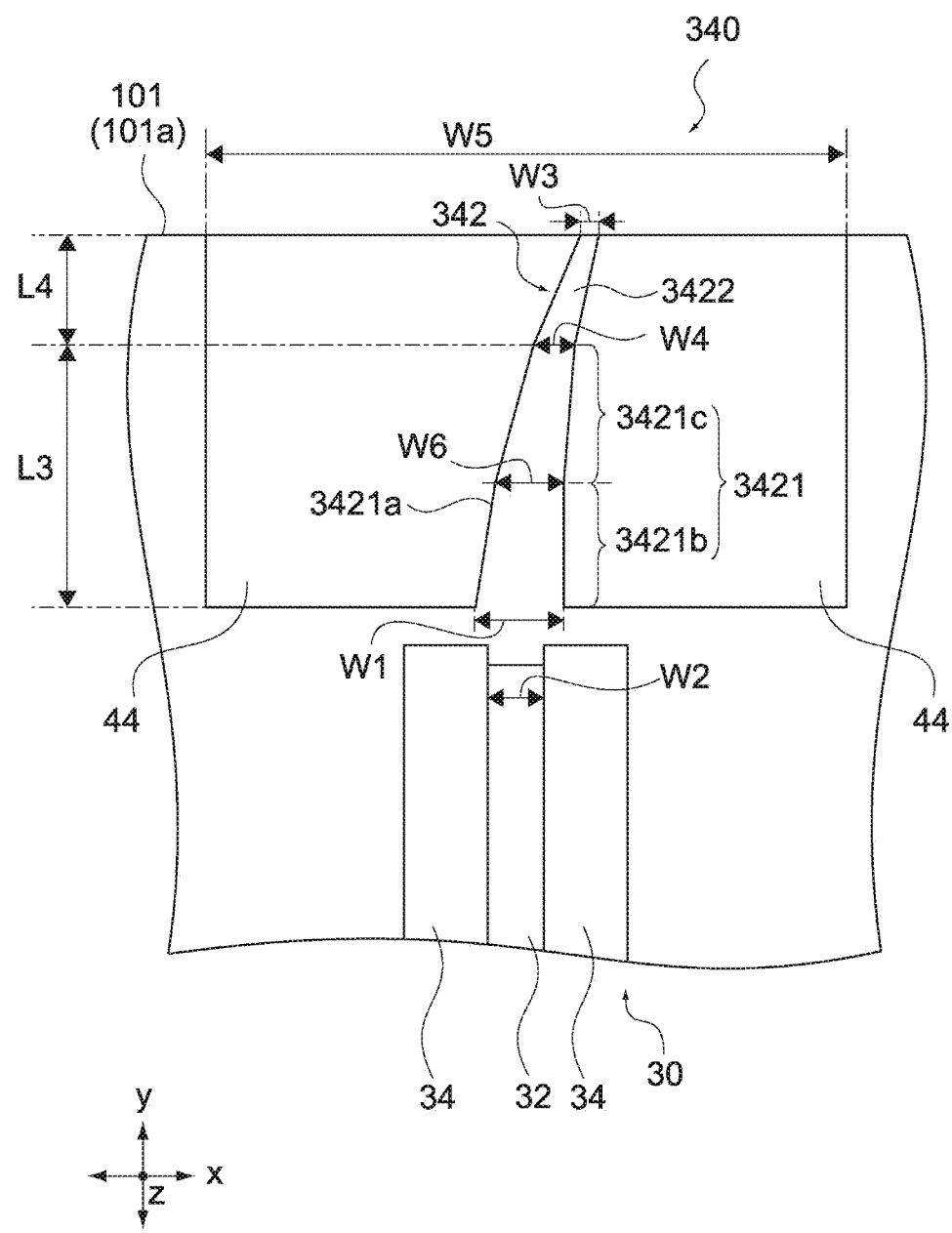
FIG. 14 is a plan view mainly showing a second region according to other embodiment 3.

FIG. 14 is a plan view mainly showing a second region 340 of the optical device 100 according to other embodiment 3. As shown in FIG. 14, the second region 340 includes the second waveguide 342. The second waveguide 342 has the structure similar to the second waveguide 42 according to the above-described embodiments except the shape, and includes a reflection structure 3421 and a taper structure 3422.

The reflection structure 3421 is positioned at the first waveguide 32 side of the second waveguide 342 and slopes the optical axis of light entered from the first waveguide 32 side. Specifically, the reflection structure 3421 may include a reflection face 3421a having the intersection point with the optical axis of the outgoing light of the first waveguide 32 (extension of the center line of the first waveguide). The reflection structure 3421 according to other embodiment 3 includes a first part 3421b and a second part 3421c. The angle of the reflection face 3421a in the first part 3421b the angle of the reflection face 3421a in the second part 3421c may be different with respect to the optical axis.

With this structure, while the angle of the reflection face 3421a in the first part 3421b with respect to the optical axis and the angle of the reflection face 3421a in the second part 3421c with respect to the optical axis are decreased, the slope of the optical axis in the reflection structure 3421 may be increased. Thus, if the slope of the optical axis in the reflection structure 3421 is greater than the total reflection angle, the light loss may be decreased.

As shown in FIG. 14, where the width of the end of the reflection structure 3421 at the first region side 30 is a denoted as width W1 and the width of the end of the first waveguide 32 at the second region 140 side is denoted as a second width W2, the width W1 may be wider than the width W2. In addition, where the width of the second waveguide 342 at a boundary between the first part 3421b and the second part 3421c is denoted as a fifth width W6, the width W6 is narrower than the width W1 and is greater than the width W4. Also, the width W6 may be similar to the width W4 and the width W1.

The taper structure 3422 of the second waveguide 342 is positioned at the light-outgoing end 101 side, and decreases a size of a beam spot of light entered from the reflection structure 3421. Specifically, the taper structure 3422 has a width gradually narrowing toward the light-outgoing end 101. Light entered to the taper structure 3422 is reflected by the interface between the taper structure 2422 and the second concave portion 44, and is collected. The taper structure 3422 may include a plurality parts having different angles with respect to the optical axis.

As shown in FIG. 14, where the width of the end of the taper structure 3422 at the light reflection end 101 side is denoted as a width W3 and the width of the end of the taper structure 3422 at the reflection structure 3421 side is denoted as a width W4, the width W3 is narrower than the width W4 and is narrower than the width W2. The width W4 may be similar to the width W2 or may be narrower than the width W2. The width W4 narrower than the width W6 or may be similar to the width W6.

As described above, light outgoing from the first waveguide 32 is sloped from an extension direction of the first waveguide 32 by the reflection structure 3421. Accordingly, even if the extension direction of the first waveguide 32 is orthogonal to the light-outgoing end face 101a, the optical axis of light outgoing from the optical device 100 is sloped with respect to the direction orthogonal to the light-outgoing end face 101a.

As a result, light reflected by the light-outgoing end face 101a is prevented from entering into the second waveguide 342, i.e., the laser oscillation of the reflected light is prevented. A slope of an optical axis of light outgoing from the second waveguide 342 toward the line perpendicular to the light-outgoing end face 101a is preferably 3 degrees or more and 15 degrees or less.

2.4) Other Embodiment 4

Figure 15:
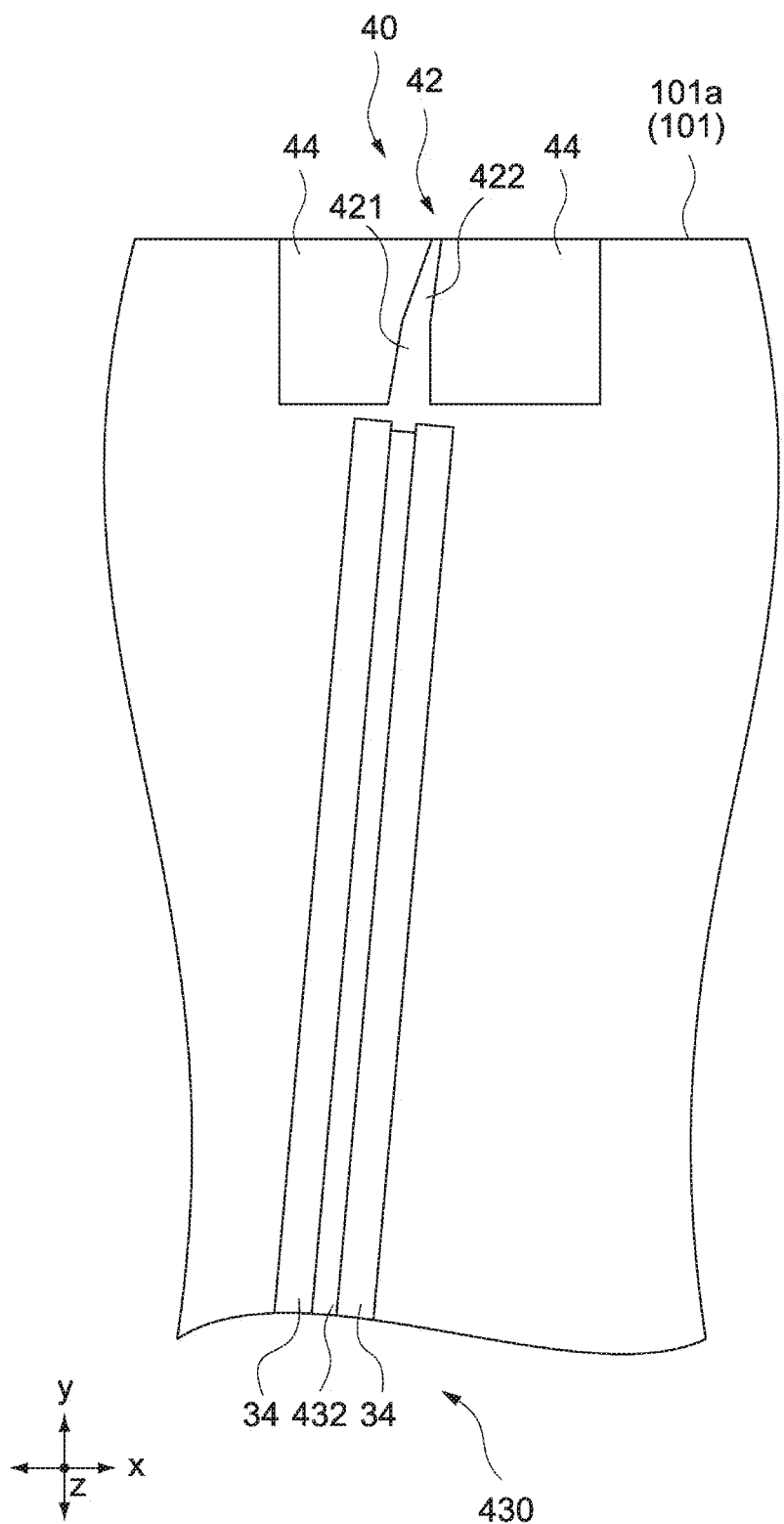
FIG. 15 is a plan view mainly showing a first region according to other embodiment 4.

FIG. 15 is a plan view mainly showing a first region 430 of the optical device 100 according to other embodiment 4. The first region 430 has a first waveguide 132. The first waveguide 132 has the structure similar to the first waveguide 32 according to the above-described embodiments except the shape.

As shown in FIG. 15, the first waveguide 432 is extended lineally in a direction sloped with respect to the longitudinal direction (Y direction) of the optical device 100, and the extension of the center line of the first waveguide 32 is sloped with respect to a straight line orthogonal to the light-outgoing end face 101a and the rear end face 102a.

Similar to the above-described embodiments, with the linear first waveguide 432, the waveguide loss in the first waveguide 432 can be prevented. In addition, since the first waveguide 432 is sloped with respect to the longitudinal direction of the optical device 100, the slope of the optical axis of the outgoing light may be increased toward the line perpendicular to the light-outgoing end face 101a.

2.5) Other Embodiment 5

Figure 16:
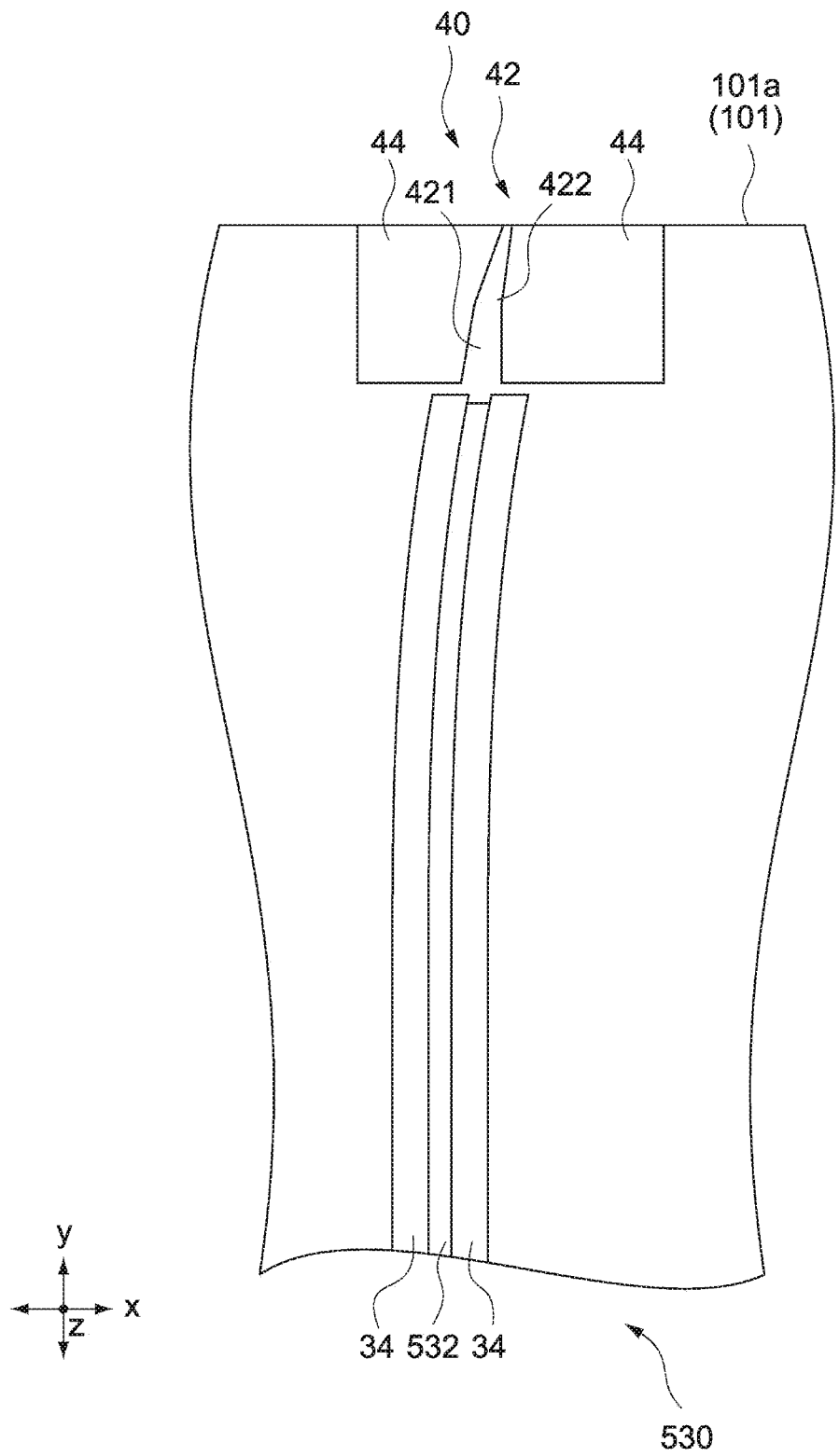
FIG. 16 is a plan view mainly showing a first region according to other embodiment 5.

FIG. 16 is a plan view mainly showing a first region 530 of the optical device 100 according to other embodiment 5. The first region 530 includes a first waveguide 532. The first waveguide 532 has the structure similar to the first waveguide 32 according to the above-described embodiments except the shape.

As shown in FIG. 16, the first waveguide 532 is extended in a curve. Here, in the optical device according to the present technology as described above, the optical axis of the outgoing light of the first waveguide 532 is sloped mainly by the second waveguide 42. Thus, as compared with the case that no second waveguide 42 is provided, the curvature of the second waveguide 532 may be increased.

As a result, the waveguide loss in the first waveguide 532 may be decreased (see FIG. 8). The curvature radius in a wave part of the second waveguide 42 is desirably 3000 μm or more. In addition, with the curved first waveguide 532, the slope of the optical axis of the outgoing light may be increased toward the line perpendicular to the light-outgoing end face 101a.

2.6) Other Embodiment 6

In other embodiment 6, any one of the above-described other embodiments 1 to 3 of the second region may be combined with any one of the above-described other embodiments 4 and 5 of the first region to form the optical device (not shown).

4. Display Apparatus

Figure 17:
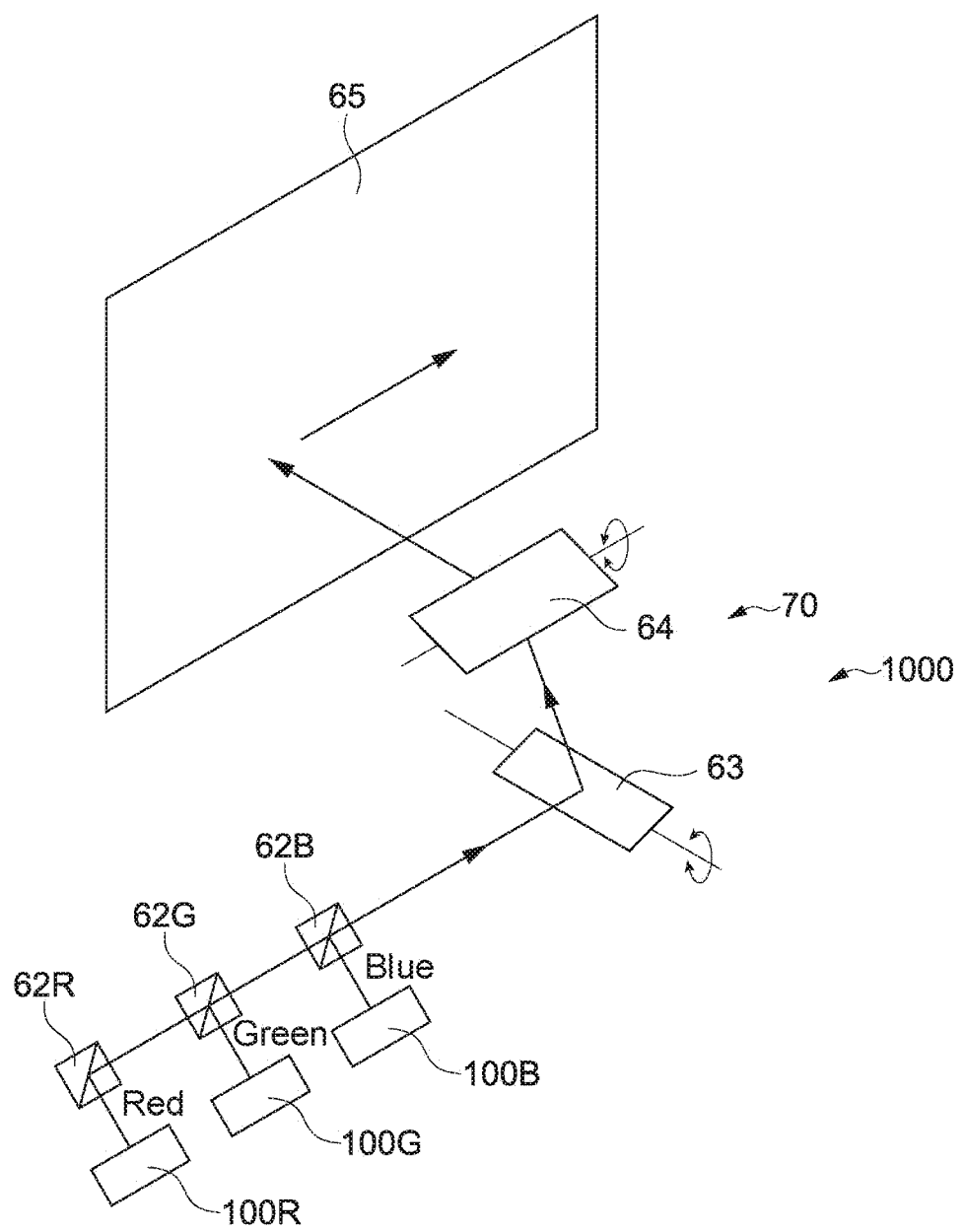
FIG. 17 is a view schematically showing a display apparatus using any of SLDs, i.e., light-emitting devices, according to the above-described respective embodiments as the light source.

FIG. 17 schematically shows a display apparatus using any of the SLDs, i.e., optical devices, according to the above-described respective embodiments as the light source. A display apparatus 1000 is a projector of a raster scan type.

The display apparatus 1000 includes an image generation unit 70. The image generation unit 70 is configured to be capable of two-dimensionally scanning, e.g., raster-scanning, the light outgoing from the optical device as the light source and controlling brightness of the light projected on a projection surface 65 such as a screen and a wall face on the basis of image data.

The image generation unit 70 mainly includes a horizontal scanner 63 and a vertical scanner 64, for example. Respective beams from an SLD 100R emitting red light, an SLD 100G emitting green light, and an SLD 100B emitting blue light are gathered by dichroic prisms 62R, 62G, and 62B into one beam. The beam is scanned by the horizontal scanner 63 and the vertical scanner 64 and is projected on the projection surface 65. As a result, an image is displayed.

Note that, among the optical devices that emit respective colors of RGB, at least one of them may be the SLD and the other devices may be general LDs.

Each of the horizontal scanner 63 and the vertical scanner 64 is formed, for example, of a combination of a polygon mirror and a galvano scanner. In this case, as a brightness control means, a circuit of controlling a current injected into the optical device, for example, is used.

Alternatively, as each of the horizontal scanner and the vertical scanner, a two-dimensional light modulator such as, for example, a DMD (Digital Micro-mirror Device) produced by using an MEMS (Micro Electro Mechanical System) technique may be used.

Alternatively, the image generation unit 70 may include a combination of a one-dimensional light modulator such as a GLV (Grating Light Valve) device and the above-described one-dimensional scan mirror.

Alternatively, the image generation unit 70 may include a refractive index modulation type scanner such as an acousto-optical effect scanner and an electro-optical effect scanner.

5. Other Various Embodiments

The embodiments of the present technology are not limited to the above-described embodiments, and other various embodiments may be available.

For example, in the embodiment described with reference to FIG. 1, the second recesses 44 of the second region 40 of the waveguide structure 50 are deeper than the active layer 15. However, the second recesses 44 may not necessarily reach the active layer 15 with respect to the depths of the second recesses 44 (depth positions of the bottom faces 44a of the second recesses 44), for example. The spirit of the present technology is that it is important that the second refractive index difference of the second region 40 is greater than the first refractive index difference of the first region 30. The refractive index difference is a feature that promotes the light confinement effect of the second region 40. The same applies to the other embodiments.

Accordingly, the first region 30 may not include the first recesses 34 arranged in the first conduction type layer 13, for example. For example, the first region 30 according to the present technology may include a current block region (i.e., current non-injection regions) of the second conduction type layer 17 arranged around the first waveguide 32 as disclosed in Japanese Patent Application Laid-open No. 2005-12044. The same applies to the other embodiments.

The SLD, i.e., the optical device according to each of the above-described embodiments has the light-outgoing end 101 and the rear end 102 opposite thereto. However, both ends of the optical device (not limited to the SLD) may be light-outgoing ends. In this case, as the waveguide structure, the second region having the second refractive index difference in the second region greater than the first refractive index difference in the first region is arranged at each of both ends (light-outgoing ends) of the optical device.

The optical device according to each embodiment is not limited to the optical device such as the SLD and may be a light amplifying device for amplifying light generated by other light source.

In the embodiments, the first conduction type is set to a p type and the second conduction type is set to an n type. Alternatively, the first conduction type may be set to an n type and the second conduction type may be set to a p type.

It is possible to combine at least two features of the respective embodiments described above.

The present technology may also have the following structures.

(1) An optical device including a substrate, a first end being a light-outgoing end, and a second end arranged at a side opposite to the first end, including:
  a stripe-shaped first electrode layer extending from the second end to the first end;
  a first conduction type layer including a current injection region formed by the first electrode layer and a current non-injection region;
  a second conduction type layer arranged on the substrate;
  an active layer arranged between the first conduction type layer and the second conduction type layer; and
  a second electrode layer being in contact with the substrate or the second conduction type layer,
    a waveguide structure included in the first conduction type layer, the active layer, and the second conduction type layer including
      a first region having a first waveguide that is the current injection region and the current non-injection region and having a first refractive index difference between a refractive index of the current injection region and a refractive index of the current non-injection region, and
      a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference,
        the second waveguide having a reflection structure that reflects light entered from the first waveguide and slopes an optical axis and a taper structure that decreases a size of a beam spot of light entered from the reflection structure.

(2) The optical device according to (1), in which
  the reflection structure includes a reflection face having an intersection point with an extension of a center line of the first waveguide.

(3) The optical device according to (1) or (2), in which
  the taper structure has a narrower width toward the first end.

(4) The optical device according to any one of (1) to (3), in which
  the first region of the waveguide structure has first recesses arranged to sandwich the first waveguide as the current non-injection region, and
  the second region of the waveguide structure has second recesses arranged to sandwich the second waveguide as the region around the second waveguide, the second recesses being deeper than the first recesses.

(5) The optical device according to (4), in which
  the second recesses include bottom faces arranged at a position deeper than a position of the active layer.

(6) The optical device according to (4) or (5), further including:
  a dielectric layer covering the second recesses.

(7) The optical device according to any one of (1) to (6), in which
  a first width being an end width of a first region side of the second waveguide is wider than a second width being an end width of a second region side of the first waveguide.

(8) The optical device according to (7), in which
  a third width being a width at the first end of the second waveguide is narrower than the second width.

(9) The optical device according to any one of (1) to (8), in which
  the second waveguide is structured such that an optical axis of light outgoing from the second waveguide is not orthogonal to an end face of the first end.

(10) The optical device according to (9), in which
  the second waveguide is structured such that the slope of the optical axis of the light outgoing from the second waveguide toward a line perpendicular to the end face of the first end is 3 degrees or more.

(11) The optical device according to any one of (1) to (10), in which
  the first waveguide is structured such that a center line of the first waveguide is straight.

(12) The optical device according to (11), in which
  the first waveguide is structured such that an extended line of the center line of the first waveguide is orthogonal to the end face of the first end.

(13) The optical device according to any one of (1) to (12), in which
  the first waveguide is structured such that an extended line of the center line of the first waveguide is orthogonal to the end face of the second end.

(14) The optical device according to any one of (1) to (13), in which
  the optical device is a super luminescent diode.

(15) A display apparatus, including:
  an optical device including a substrate, a first end being a light-outgoing end, and a second end arranged at a side opposite to the first end; and
  an image generation unit capable of two-dimensionally scanning light outgoing from the optical device and controlling brightness of projected light on a basis of image data,
  the optical device including
    a stripe-shaped first electrode layer extending from the second end to the first end,
    a first conduction type layer including a current injection region formed by the first electrode layer and a current non-injection region, a second conduction type layer arranged on the substrate, an active layer arranged between the first conduction type layer and the second conduction type layer, and a second electrode layer being in contact with the substrate or the second conduction type layer, the first conduction type layer, the active layer, and the second conduction type layer including a waveguide structure, the waveguide structure including a first region having a first waveguide that is the current injection region and the current non-injection region and having a first refractive index difference between a refractive index of the current injection region and a refractive index of the current non-injection region, and a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference, the second waveguide having a reflection structure that reflects light entered from the first waveguide and slopes an optical axis and a taper structure that decreases a size of a beam spot of light entered from the reflection structure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 11 first electrode layer
12 second electrode layer
13 first conduction type layer
15 active layer
17 second conduction type layer
19 substrate
30, 430, 530 first region
32, 432, 532 first waveguide
34 first recess
40, 140, 240, 340 second region
42, 142, 242, 342 second waveguide
42b end
44a bottom face
44 second recess
50 waveguide structure
70 image generation unit
100 optical device
101 light-outgoing end
101a light-outgoing end face
102 rear end
102a rear end face
421, 1421, 2421, 3421 reflection structure
422, 1422, 2422, 3422 taper structure
1000 display apparatus

The invention claimed is:

1. An optical device including a substrate, a first end being a light-outgoing end, and a second end arranged at a side opposite to the first end, comprising:

a stripe-shaped first electrode layer extending from the second end to the first end;

a first conduction type layer including a current injection region formed by the first electrode layer and a current non-injection region;

a second conduction type layer arranged on the substrate;

an active layer arranged between the first conduction type layer and the second conduction type layer; and a second electrode layer being in contact with the substrate or the second conduction type layer, a waveguide structure included in the first conduction type layer, the active layer, and the second conduction type layer including a first region having a first waveguide that is the current injection region and the current non-injection region and having a first refractive index difference between a refractive index of the current injection region and a refractive index of the current non-injection region, and a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference, the second waveguide having a reflection structure that reflects light entered from the first waveguide and slopes an optical axis and a taper structure that decreases a size of a beam spot of light entered from the reflection structure.

2. The optical device according to claim 1, wherein the reflection structure includes a reflection face having an intersection point with an extension of a center line of the first waveguide.

3. The optical device according to claim 1, wherein the taper structure has a narrower width toward the first end.

4. The optical device according to claim 1, wherein the first region of the waveguide structure has first recesses arranged to sandwich the first waveguide as the current non-injection region, and the second region of the waveguide structure has second recesses arranged to sandwich the second waveguide as the region around the second waveguide, the second recesses being deeper than the first recesses.

5. The optical device according to claim 4, wherein the second recesses include bottom faces arranged at a position deeper than a position of the active layer.

6. The optical device according to claim 4, further comprising:

a dielectric layer covering the second recesses.

7. The optical device according to claim 1, wherein a first width being an end width of a first region side of the second waveguide is wider than a second width being an end width of a second region side of the first waveguide.

8. The optical device according to claim 7, wherein a third width being a width at the first end of the second waveguide is narrower than the second width.

9. The optical device according to claim 1, wherein the second waveguide is structured such that an optical axis of light outgoing from the second waveguide is not orthogonal to an end face of the first end.

10. The optical device according to claim 9, wherein the second waveguide is structured such that the slope of the optical axis of the light outgoing from the second waveguide toward a line perpendicular to the end face of the first end is 3 degrees or more.

11. The optical device according to claim 1, wherein the first waveguide is structured such that a center line of the first waveguide is straight.

12. The optical device according to claim 11, wherein the first waveguide is structured such that an extended line of the center line of the first waveguide is orthogonal to the end face of the first end.

13. The optical device according to claim 1, wherein the first waveguide is structured such that an extended line of the center line of the first waveguide is orthogonal to the end face of the second end.

14. The optical device according to claim 1, wherein the optical device is a super luminescent diode.

15. A display apparatus, comprising:
an optical device including a substrate, a first end being a light-outgoing end, and a second end arranged at a side opposite to the first end; and
an image generation unit capable of two-dimensionally scanning light outgoing from the optical device and controlling brightness of projected light on a basis of image data,
the optical device including
a stripe-shaped first electrode layer extending from the second end to the first end,
a first conduction type layer including a current injection region formed by the first electrode layer and a current non-injection region,
a second conduction type layer arranged on the substrate,
an active layer arranged between the first conduction type layer and the second conduction type layer, and
a second electrode layer being in contact with the substrate or the second conduction type layer,
the first conduction type layer, the active layer, and the second conduction type layer including a waveguide structure, the waveguide structure including
a first region having a first waveguide that is the current injection region and the current non-injection region and having a first refractive index difference between a refractive index of the current injection region and a refractive index of the current non-injection region, and
a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference,
the second waveguide having a reflection structure that reflects light entered from the first waveguide and slopes an optical axis and a taper structure that decreases a size of a beam spot of light entered from the reflection structure.

* * * * *